US011518882B1

(12) United States Patent
Xu et al.

(10) Patent No.: US 11,518,882 B1
(45) Date of Patent: Dec. 6, 2022

(54) RESIN COMPOSITION AND ARTICLE MADE THEREFROM

(71) Applicant: Elite Electronic Material (Zhongshan) Co., Ltd., Zhongshan (CN)

(72) Inventors: Teng Xu, Zhongshan (CN); Zhilong Hu, Zhongshan (CN); Shuwen Liu, Zhongshan (CN); Cheng Li, Zhongshan (CN); Yuhui Liu, Zhongshan (CN)

(73) Assignee: ELITE ELECTRONIC MATERIAL (ZHONGSHAN) CO., LTD., Zhongshan (CN)

( * ) Notice: Subject to any disclaimer, the term of this patent is extended or adjusted under 35 U.S.C. 154(b) by 0 days.

(21) Appl. No.: 17/670,673

(22) Filed: Feb. 14, 2022

(30) Foreign Application Priority Data

Dec. 22, 2021 (CN) .......................... 202111579788.2

(51) Int. Cl.
*C08L 79/08* (2006.01)
*H05K 1/03* (2006.01)
*B32B 15/20* (2006.01)

(52) U.S. Cl.
CPC .............. *C08L 79/08* (2013.01); *B32B 15/20* (2013.01); *H05K 1/0346* (2013.01); *B32B 2270/00* (2013.01); *B32B 2457/08* (2013.01)

(58) Field of Classification Search
CPC ..... C08L 79/08; B32B 15/20; B32B 2270/00; B32B 2457/08; H05K 1/0346
USPC ....................................................... 428/209
See application file for complete search history.

(56) References Cited

U.S. PATENT DOCUMENTS

| 4,908,417 A | * | 3/1990 | Shiomi | ................ | C08G 77/455 |
| | | | | | 525/422 |
| 2018/0362715 A1 | * | 12/2018 | Hsieh | ................... | C08G 73/124 |
| 2019/0144632 A1 | * | 5/2019 | Zhang | .................. | C08K 5/0025 |
| | | | | | 525/332.5 |
| 2020/0095504 A1 | * | 3/2020 | Hu | ........................ | C07F 9/5316 |

* cited by examiner

*Primary Examiner* — Betelhem Shewareged
(74) *Attorney, Agent, or Firm* — Muncy, Geissler, Olds & Lowe, P.C.

(57) ABSTRACT

A resin composition includes the following components or a prepolymerized product thereof. (A) 100 parts by weight of a prepolymer and (B) 5 parts by weight to 30 parts by weight of a diallyl bisphenol resin, wherein the prepolymer is prepared by subjecting a reaction mixture to a prepolymerization reaction, the reaction mixture includes a maleimide resin, an amino-modified silicone and cyclohexanone, and relative to a total of 100 parts by weight of the maleimide resin, the amino-modified silicone and the cyclohexanone, the reaction mixture includes 60 parts by weight to 80 parts by weight of the maleimide resin, 15 parts by weight to 30 parts by weight of the amino-modified silicone and 2 parts by weight to 15 parts by weight of the cyclohexanone; the reaction mixture does not include m-aminophenol or p-aminophenol; and the amino-modified silicone has an amino equivalent of 750 g/mol to 2500 g/mol. Moreover, the resin composition described above may also be made into articles such as a prepreg, a resin film, a laminate or a printed circuit board.

17 Claims, 2 Drawing Sheets

RESIN COMPOSITION AND ARTICLE MADE THEREFROM

CROSS-REFERENCE TO RELATED APPLICATION

This application claims the priority benefits of China Patent Application No. 202111579788.2, filed on Dec. 22, 2021. The entirety the above-mentioned patent application is hereby incorporated by reference herein and made a part of this specification.

BACKGROUND

1. Field of the Disclosure

The present disclosure mainly relates to a resin composition and more particularly to a resin composition comprising a prepolymer and a diallyl bisphenol resin or a prepolymerized product thereof, which is useful for preparing an article such as a prepreg, a resin film, a laminate or a printed circuit board.

2. Description of Related Art

Recently, the electronic technology has been developed towards higher density, lower power consumption and higher performance, thereby presenting more challenges to the high performance electronic materials.

Higher interconnection density per unit area of electronic devices presents higher demands on the processability of circuit boards. The fabrication of printed circuit board traces usually involves etching of copper foils, particularly when forming fine wiring circuits, the use of ordinary copper foil (such as a copper foil with a thickness of between 18 and 35 μm) is not able to meet the high requirements of copper foil peeling strength in printed circuit boards due to the limitations of certain conditions in the etching process. While using ultra-thin copper foils (such as a thickness of less than or equal to 6 μm) has encountered many problems in the existing fabrication processes. For example, ultra-thin copper foils are prone to roughness change during trace processing and may cause weakened adhesiveness, which results in poor adhesion between the ultra-thin copper foils and insulation resin layers and accompanying problems such as circuit peeling off. Therefore, it is the concern of the industry to solve the problems associated to glass transition temperature, coefficient of thermal expansion, ordinary copper foil peeling strength and ultra-thin copper foil peeling strength so as to ensure the stability of material quality.

SUMMARY

To overcome the problems of prior arts, particularly one or more above-mentioned property demands facing conventional materials, it is a primary object of the present disclosure to provide a resin composition and an article made therefrom which may overcome at least one of the above-mentioned technical problems.

Specifically, the resin composition disclosed herein or an article made therefrom achieves improvement in one or more of the following properties: glass transition temperature, copper foil peeling strength, and X-axis coefficient of thermal expansion.

To achieve the aforesaid one or more objects, in one aspect, disclosed herein is a resin composition comprising the following components or a prepolymerized product thereof: (A) 100 parts by weight of a prepolymer and (B) 5 parts by weight to 30 parts by weight of a diallyl bisphenol resin, wherein the prepolymer is prepared by subjecting a reaction mixture to a prepolymerization reaction, the reaction mixture includes a maleimide resin, an amino-modified silicone and cyclohexanone, and relative to a total of 100 parts by weight of the maleimide resin, the amino-modified silicone and the cyclohexanone, the reaction mixture comprises 60 parts by weight to 80 parts by weight of the maleimide resin, 15 parts by weight to 30 parts by weight of the amino-modified silicone and 2 parts by weight to 15 parts by weight of the cyclohexanone; the reaction mixture does not include m-aminophenol or p-aminophenol; and the amino-modified silicone has an amino equivalent of 750 g/mol to 2500 g/mol.

For example, in one embodiment, the diallyl bisphenol resin comprises a compound of Formula (I) or a combination thereof:

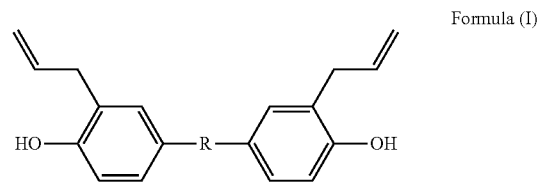

Formula (I)

in Formula (I), R is —C(CH$_3$)$_2$—, —CH$_2$— or —SO$_2$—.

For example, in one embodiment, the maleimide resin comprises oligomer of phenylmethane maleimide, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenylmaleimide, maleimide resin containing aliphatic long-chain structure or a combination thereof.

For example, in one embodiment, the amino-modified silicone comprises a compound of Formula (II):

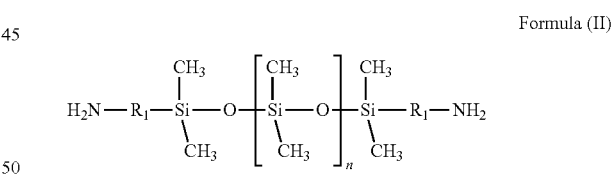

Formula (II)

in Formula (II), each $R_1$ independently represents a $C_1$-$C_{10}$ alkylene group, and n is an integer of 0 or greater.

For example, in one embodiment, the reaction mixture is reacted at 110° C. to 140° C. for 2 to 4 hours to prepare the prepolymer.

For example, in one embodiment, the component (A) and the component (B) are reacted at 110° C. to 140° C. for 20 to 60 minutes to prepare the prepolymerized product.

For example, in one embodiment, the cyclohexanone has a conversion rate of 50% to 95% in the prepolymerization reaction.

For example, in one embodiment, the reaction mixture comprises propylene glycol monomethyl ether, ethylene glycol methyl ether acetate, propylene glycol methyl ether acetate or a combination thereof as a solvent.

For example, in one embodiment, a solution of the prepolymer is homogeneous (i.e., not forming layer separation) after being stood still at room temperature for 24 hours.

For example, in one embodiment, the resin composition further comprises a cyanate ester resin, a polyolefin resin, a small molecule vinyl compound, an acrylate resin, a phenolic resin, a polyphenylene ether resin, an epoxy resin, a benzoxazine resin, a styrene maleic anhydride resin, a polyester resin, an amine curing agent, a polyamide resin, a polyimide resin, or a combination thereof.

For example, in one embodiment, the resin composition further comprises flame retardant, inorganic filler, curing accelerator, polymerization inhibitor, coloring agent, solvent, toughening agent, silane coupling agent, or a combination thereof.

In another aspect, the present disclosure provides an article made from the resin composition described above, which comprises a prepreg, a resin film, a laminate or a printed circuit board.

For example, in one embodiment, the article is a resin film, a laminate, or a printed circuit board and comprises an insulation layer formed by the aforesaid resin composition and a copper foil having a thickness of less than or equal to 6 μm disposed on the insulation layer.

For example, in one embodiment, the article further comprises a removable carrier disposed on the copper foil.

For example, in one embodiment, the resin composition disclosed herein or the article made therefrom has one, more or all of the following properties:
- a glass transition temperature as measured by using dynamic mechanical analysis by reference to IPC-TM-650 2.4.24.4 of greater than or equal to 284° C.;
- an X-axis coefficient of thermal expansion as measured by reference to IPC-TM-650 2.4.24.5 of less than or equal to 7.6 ppm/° C.;
- the article comprising a copper foil having a thickness of greater than or equal to 35 μm and having a copper foil peeling strength as measured by reference to IPC-TM-650 2.4.8 of greater than or equal to 4.5 lb/in; and
- the article comprising a copper foil having a thickness of less than or equal to 3 μm and having a copper foil peeling strength as measured by reference to IPC-TM-650 2.4.8 of greater than or equal to 5.0 lb/in.

DESCRIPTION OF THE EMBODIMENTS

Figure 1:
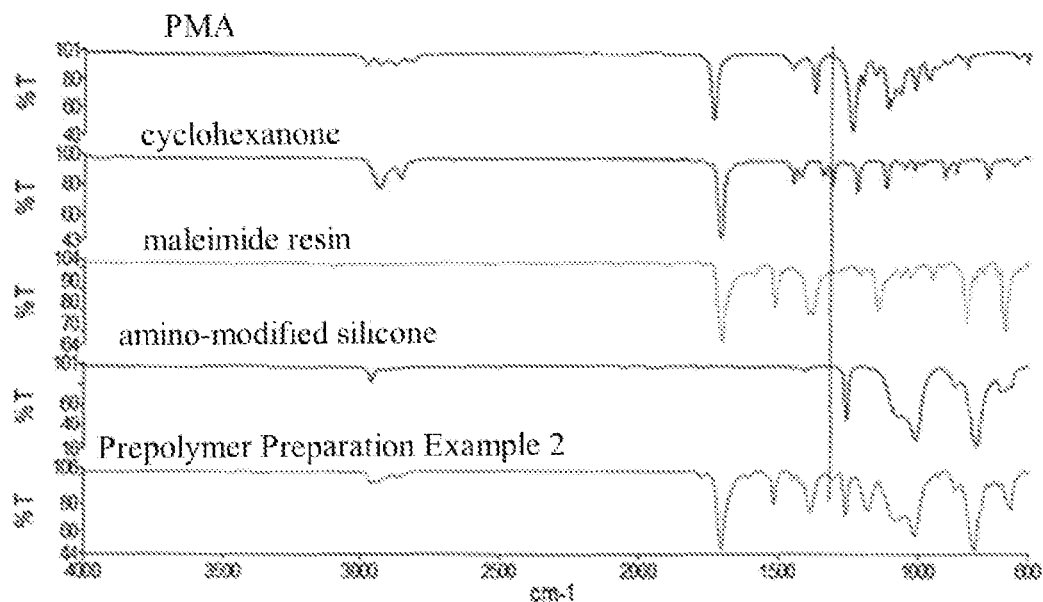
FIG. 1 illustrates the FTIR spectrum of the product and the reactant of Prepolymer Preparation Example 2.

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "encompasses," "encompassing," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed or inherent to such composition or article of manufacture. Further, unless expressly stated to the contrary, the term "or" refers to an inclusive or and not to an exclusive or. For example, a condition "P or Q" is satisfied by any one of the following: P is true (or present) and Q is false (or not present), P is false (or not present) and Q is true (or present), and both P and Q are true (or present). In addition, whenever open-ended transitional phrases are used, such as "comprises," "comprising," "includes," "including," "encompasses," "encompassing," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Similarly, a range of "between 1 and 8" should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless of broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of X1, X2 and X3," it is intended to disclose the situations of X is X1 and X is X1 and/or X2 and/or X3. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of X1, X2 and X3" and Y is described as being "selected from a group consisting of Y1, Y2 and Y3," the disclosure includes any combination of X is X1 or X2 or X3 and Y is Y1 or Y2 or Y3. As used herein, "or a combination thereof" means "or any combination thereof".

As used herein, unless otherwise specified, the term "resin" is a widely used common name of a synthetic polymer and is construed in the present disclosure as comprising monomer and its combination, polymer and its combination or a combination of monomer and its polymer, but not limited thereto. For example, in the present disclosure, the term "maleimide resin" is construed to encompass a maleimide monomer (a small molecule compound of maleimide), a maleimide polymer, a combination of maleimide monomers, a combination of maleimide polymers, and a combination of maleimide monomer(s) and maleimide polymer(s).

Unless otherwise specified, according to the present disclosure, a compound refers to a chemical substance formed by two or more elements bonded with chemical bonds and may comprise a small molecule compound and a polymer compound, but not limited thereto. Any compound disclosed herein is interpreted to not only include a single chemical substance but also include a class of chemical substances having the same kind of components or having the same property. In addition, as used herein, a mixture may include two or more compounds and may include a copolymer or auxiliaries, but not limited thereto.

Unless otherwise specified, according to the present disclosure, a polymer refers to the product formed by monomer(s) via polymerization and usually comprises multiple aggregates of polymers respectively formed by multiple repeated simple structure units by covalent bonds; the monomer refers to the compound forming the polymer. A polymer may comprise a homopolymer, a copolymer, a prepolymer, etc., but not limited thereto. For example, the term "diene polymer" as used herein is construed as comprising diene homopolymer, diene copolymer, diene prepolymer and diene oligomer.

A homopolymer refers to a chemical substance formed by a single compound via polymerization, addition polymerization or condensation polymerization. A copolymer refers to a chemical substance formed by two or more compounds via polymerization, addition polymerization or condensation polymerization and may comprise: random copolymers, such as a structure of -SSTSTTTSSSTTS-; alternating copolymers, such as a structure of -STSTSTST-; graft copolymers, such as a structure of -SS(S-TTTT)SS(S-TTTT)SSS-; and block copolymers, such as a structure of -SSSSS-TTTTT-SSSSS-.

A prepolymer refers to a product, derived from a compound or a mixture (monomer) that is subjected to prepolymerization (partial polymerization), which contains unreacted reactive functional groups or has the potential to undergo further polymerization. For example, the progress of the prepolymerization reaction may be confirmed and controlled as needed by determining the molecular weight or the level of viscosity. For example, as used herein, the prepolymer of maleimide resin, amino-modified silicone and cyclohexanone refers to a product obtained by subjecting maleimide resin, amino-modified silicone and cyclohexanone to a certain degree of polymerization to achieve an intermediate molecular weight or a proper viscosity; the prepolymer contains a reactive functional group capable of participating further polymerization to obtain the final product which has been fully crosslinked or cured.

To those of ordinary skill in the art to which this disclosure pertains, a resin composition containing an additive and three compounds (e.g., K, J and L), a total of four components, is different form a resin composition containing the additive and a prepolymer formed by the three compounds (e.g., K, J and L), a total of two components, as they are completely different from each other in the aspects of preparation method, physical or chemical properties of the resin composition and properties of an article or product made therefrom. For example, the former involves mixing K, J, L and the additive to form the resin composition; in contrast, the latter involves first subjecting a reaction mixture comprising K, J and L to a prepolymerization reaction at proper conditions to form a prepolymer and then mixing the prepolymer with the additive to form the resin composition. For example, to those of ordinary skill in the art to which this disclosure pertains, the two resin compositions have completely different compositions; in addition, because the prepolymer formed by K, J, and L functions completely different from K, J, and L individually or collectively in the resin composition, the two resin compositions should be construed as completely different chemical substances and have completely different chemical statuses. For example, to those of ordinary skill in the art to which this disclosure pertains, because the two resin compositions are completely different chemical substances, articles made therefrom will not have the same properties. For example, to a resin composition containing a crosslinking agent and a prepolymer formed by K, J, and L, since K, J, and L have been partially reacted or converted during the prepolymerization reaction to form the prepolymer, during the process of heating to semi-cure the resin composition at a high temperature condition, a partial crosslinking reaction occurs between the prepolymer and the crosslinking agent but not between K, J, and L individually and the crosslinking agent. As such, articles made from the two resin compositions will be completely different and have completely different properties.

The term "polymer" includes but is not limited to an oligomer. An oligomer refers to a polymer with 2-20, typically 2-5, repeating units.

Unless otherwise specified, according to the present disclosure, a modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc.

Unless otherwise specified, an alkyl group, an alkenyl group and a hydrocarbyl group described herein are construed to encompass various isomers thereof. For example, a propyl group is construed to encompass n-propyl and iso-propyl.

Unless otherwise specified, in the present disclosure, the term "vinyl-containing" is construed to encompass the inclusion of a vinyl group, a vinylene group, an allyl group, a (meth)acrylate group or a combination thereof.

The unsaturated bond described herein, unless otherwise specified, refers to a reactive unsaturated bond, such as but not limited to an unsaturated double bond with the potential of being crosslinked with other functional groups, such as an unsaturated carbon-carbon double bond with the potential of being crosslinked with other functional groups, but not limited thereto.

Unless otherwise specified, according to the present disclosure, when the term acrylate or acrylonitrile is expressed as (meth)acrylate or (meth)acrylonitrile, it is intended to comprise both situations of containing and not containing a methyl group; for example, poly(meth)acrylate is construed as including polyacrylate and polymethacrylate. For example, (meth)acrylonitrile is construed as including acrylonitrile and methacrylonitrile.

As used herein, part(s) by weight represents weight part(s) in any weight unit, such as but not limited to kilogram, gram, pound and so on. For example, 100 parts by weight of the prepolymer may represent 100 kilograms of the prepolymer or 100 pounds of the prepolymer.

The following embodiments and examples are illustrative in nature and are not intended to limit the present disclosure and its application. In addition, the present disclosure is not bound by any theory described in the background and summary above or the following embodiments or examples. Unless otherwise specified, processes, reagents and conditions described in the examples are those known in the art.

As described above, the primary object of this disclosure is to provide a resin composition comprising the following components or a prepolymerized product thereof: (A) 100 parts by weight of a prepolymer and (B) 5 parts by weight to 30 parts by weight of a diallyl bisphenol resin, wherein the prepolymer is prepared by subjecting a reaction mixture to a prepolymerization reaction, the reaction mixture includes a maleimide resin, an amino-modified silicone and cyclohexanone, and relative to a total of 100 parts by weight of the maleimide resin, the amino-modified silicone and the cyclohexanone, the reaction mixture includes 60 parts by weight to 80 parts by weight of the maleimide resin, 15 parts by weight to 30 parts by weight of the amino-modified silicone and 2 parts by weight to 15 parts by weight of the cyclohexanone; the reaction mixture does not include m-aminophenol or p-aminophenol; and the amino-modified silicone has an amino equivalent of 750 g/mol to 2500 g/mol.

In one embodiment, for example, the resin composition comprises 100 parts by weight of the prepolymer and 5 to 30 parts by weight of the diallyl bisphenol resin. In one embodiment, for example, the resin composition comprises the prepolymerized product formed by 100 parts by weight of the prepolymer and 5 to 30 parts by weight of the diallyl bisphenol resin.

In one embodiment, for example, the diallyl bisphenol resin may comprise, but not limited to, diallyl bisphenol A, diallyl bisphenol F, and diallyl bisphenol S. Specifically, The diallyl bisphenol resin described herein comprises a compound of Formula (I) or a combination thereof:

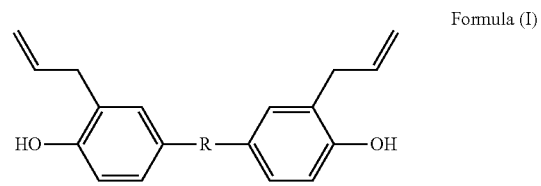

Formula (I)

in Formula (I), R is —C(CH$_3$)$_2$—, —CH$_2$— or —SO$_2$—.

In the resin composition of the present disclosure, the "prepolymer" and the "prepolymerized product" are different components. The former is the component (A), and the latter is the product obtained by subjecting the component (A) and the component (B) to a prepolymerization reaction. In other words, in the resin composition of the present disclosure, the "prepolymer" is the product obtained by subjecting 60 to 80 parts by weight of maleimide resin, 15 to 30 parts by weight of amino-modified silicone, and 2 to 15 parts by weight of cyclohexanone to a prepolymerization reaction under proper conditions. In contrast, in the resin composition of the present disclosure, the "prepolymerized product" is the product obtained by subjecting 100 parts by weight of the aforesaid "prepolymer" and 5 to 30 parts by weight of the diallyl bisphenol resin to a prepolymerization reaction under proper conditions.

In one embodiment, for example, unless otherwise specified, the maleimide resin used herein refers to a compound or a mixture containing at least one maleimide group. The maleimide resin used in the present disclosure is not particularly limited and may include any one or more maleimide resins useful for preparing a prepreg, a resin film, a laminate or a printed circuit board. Examples include but are not limited to oligomer of phenylmethane maleimide, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl) hexane, N-2,3-xylylmaleimide, N-2,6-xylylmaleimide, N-phenylmaleimide, maleimide resin containing aliphatic long-chain structure or a combination thereof, but not limited thereto.

For example, the maleimide resin may include products such as BMI-2000, BMI-2300, BMI-3000, BMI-3000H, BMI-4000H, BMI-5000, BMI-5100, BM-7000 and BMI-7000H available from Daiwakasei Co., Ltd., or products such as BMI-70 and BMI-80 available from K.I Chemical Industry Co., Ltd.

For example, the maleimide resin containing aliphatic long-chain structure may include products such as BMI-689, BMI-1400, BMI-1500, BMI-1700, BMI-2500, BMI-3000, BMI-5000 and BMI-6000 available from Designer Molecules Inc. For example, the maleimide resin containing aliphatic long-chain structure may have at least one maleimide group bonded with a substituted or unsubstituted long-chain aliphatic group. The long-chain aliphatic group may be a C$_5$ to C$_{50}$ aliphatic group, such as C$_{10}$ to C$_{50}$, C$_{20}$ to C$_{50}$, C$_{30}$ to C$_{50}$, C$_{20}$ to C$_{40}$, or C$_{30}$ to C$_{40}$, but not limited thereto. Examples of commercial maleimide resins containing aliphatic long-chain structure include:

BMI-689
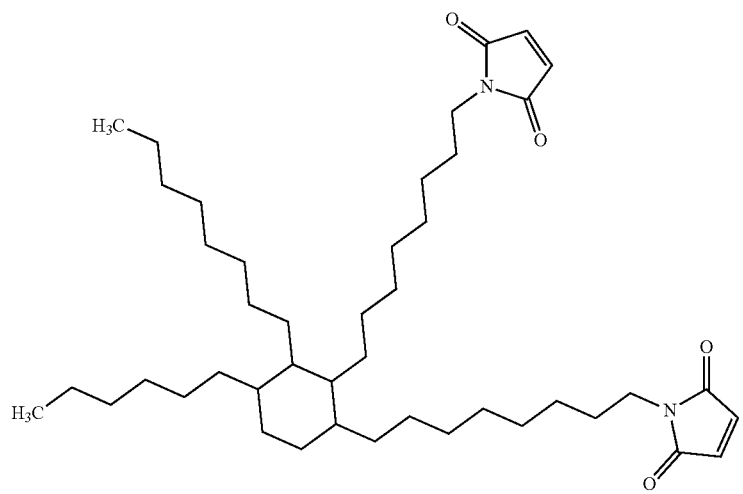
BMI-1400
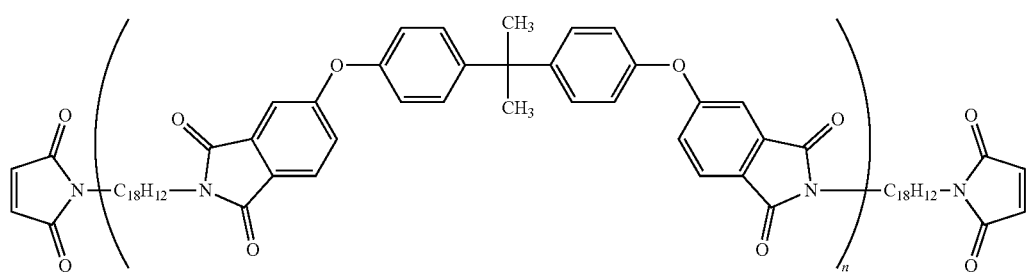
wherein n = 1 to 10
BMI-1500
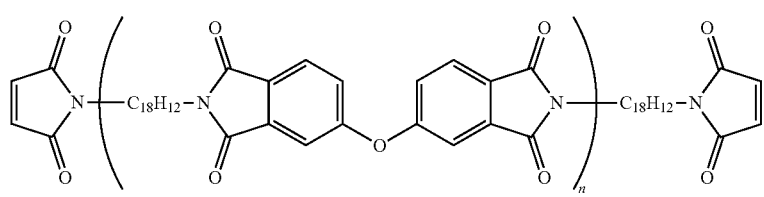
average n = 1.3
BMI-1700
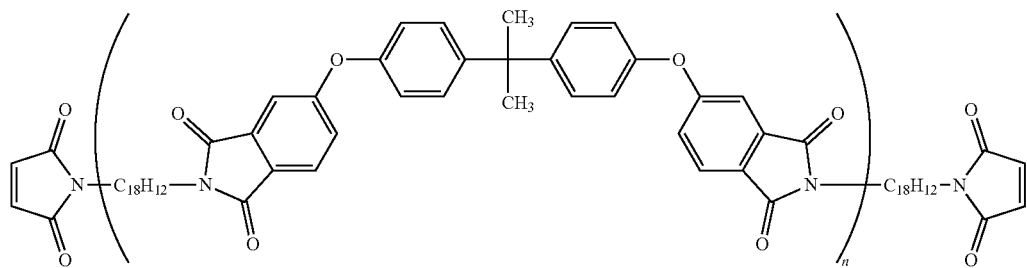
wherein n = 1 to 10

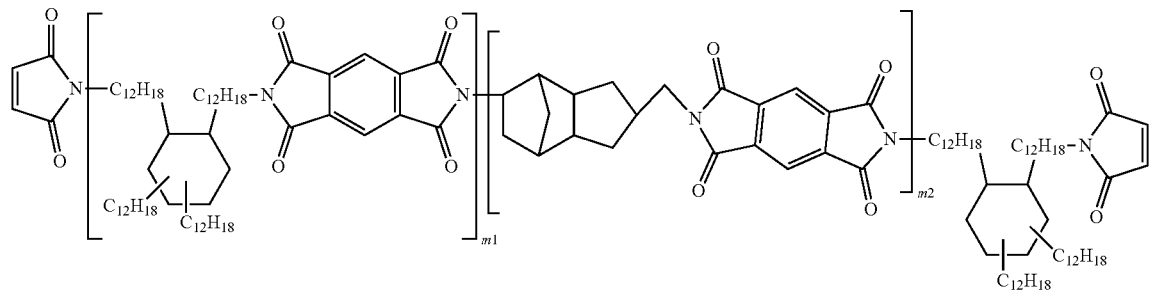

BMI-2500 m1 = 3(average); m2 = 3(average)

BMI-3000, BMI-5000, BMI-6000

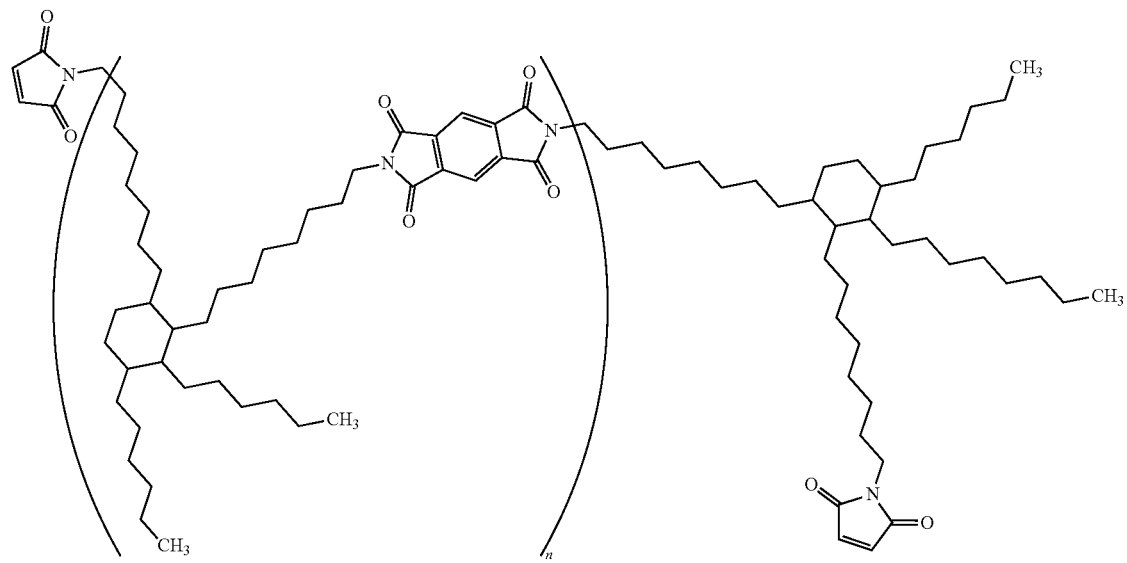

wherein n = 1 to 10

For example, in one embodiment, the amino-modified silicone disclosed herein comprises a compound of Formula (II):

Formula (II)

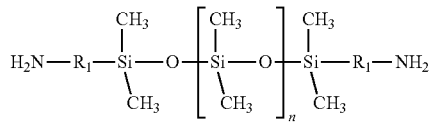

In Formula (II), each $R_1$ independently represents a $C_1$-$C_{10}$ alkylene group, and n is an integer of 0 or greater. For example, in one embodiment, the value of n of the amino-modified silicone is not particularly limited, preferably being an integer of 1 to 64, such as 10, 20, 30, 40, 50 or 60. For example, in one embodiment, group $R_1$ of the amino-modified silicone may comprise a $C_2$-$C_3$ alkylene group, a $C_2$-$C_5$ alkylene group, a $C_6$ alkylene group, or a $C_7$-$C_9$ alkylene group, but not limited thereto.

As used herein, the amino-modified silicone has an amino equivalent of 750 g/mol to 2500 g/mol, such as 750 g/mol, 800 g/mol, 900 g/mol, 1000 g/mol, 1500 g/mol, 2200 g/mol or 2500 g/mol, but not limited thereto. Unless otherwise specified, the amino equivalent refers to the mass of the amino-modified silicone having 1 mole of amino group, in g/mol. Using the amino-modified silicone having an amino equivalent of 750 g/mol to 2500 g/mol is beneficial to achieve one or more properties of the article made therefrom, including decreasing the X-axis coefficient of thermal expansion, increasing the glass transition temperature, and increasing the copper foil peeling strength.

For example, the amino-modified silicone may comprise, but not limited to, commercially available products such as X-22-161A, X-22-161B, KF-8012 and X-22-1660B-3 from Shin-Etsu Chemical Co., Ltd.

The prepolymer used in the resin composition disclosed herein is prepared by subjecting a reaction mixture to a prepolymerization reaction, wherein the reaction mixture comprises a maleimide resin, an amino-modified silicone and a cyclohexanone. The amount ratio of the maleimide resin, the amino-modified silicone and the cyclohexanone is in a range of 60-80:15-30:2-15. In other words, relative to a total of 100 parts by weight of the maleimide resin, the amino-modified silicone and the cyclohexanone, the reaction mixture comprises 60 parts by weight to 80 parts by weight of the maleimide resin (such as but not limited to 60, 65, 70, 75 or 80 parts by weight), 15 parts by weight to 30 parts by weight of the amino-modified silicone (such as but not limited to 15, 20, 25 or 30 parts by weight) and 2 parts by weight to 15 parts by weight of the cyclohexanone (such as but not limited to 2, 5, 8, 10, 12 or 15 parts by weight).

In the process of preparing the prepolymer used in the resin composition disclosed herein, m-aminophenol or p-aminophenol was not used. In this regard, the inventors have found that if m-aminophenol or p-aminophenol is used in the process of preparing the prepolymer, phase separation may occur in the product solution, which may unfavorably affect one or more properties including X-axis coefficient of thermal expansion, copper foil peeling strength, and glass transition temperature.

For example, in one embodiment, a process of preparing the prepolymer described above includes adding the maleimide resin and the cyclohexanone to a solvent and mixing and stirring at a high temperature such as 100° C. to 110° C. After the solution is fully dissolved, the amino-modified silicone is added, and the reaction is carried out at a high temperature such as 110° C. to 140° C. for 2 to 4 hours to obtain the prepolymer of maleimide resin, amino-modified silicone and cyclohexanone.

For example, in one embodiment, the viscosity of the prepolymer as measured by using a rotational viscometer is preferably 200 to 1000 mPa·s (a.k.a. CPS).

In the process of preparing the prepolymer by prepolymerizing the maleimide resin, the amino-modified silicone and the cyclohexanone, relative to a total of 100 parts by weight of the maleimide resin, the amino-modified silicone and the cyclohexanone, the maleimide resin is 60 parts by weight to 80 parts by weight, the amino-modified silicone is 15 parts by weight to 30 parts by weight, the cyclohexanone is 2 parts by weight to 15 parts by weight, and the amount or ratio of the maleimide resin, the amino-modified silicone and the cyclohexanone may be such as 80:15:5, 78:20:2, 73:20:7, 60:25:15, 68:30:2 or 67:30:3, but not limited thereto.

For example, during the prepolymerization reaction for preparing the prepolymer, a carbon-carbon unsaturated double bond of the maleimide resin may react with a hydrogen atom at the α-position of the cyclohexanone in an alkaline condition or react with an amino group (—NH$_2$) of the amino-modified silicone. Unless otherwise specified, the hydrogen atom at the α-position refers to the hydrogen atom on the carbon atom (α-carbon) connected with the functional group (e.g., carbonyl group of the cyclohexanone).

On the other hand, the prepolymerized product of the present disclosure may be obtained by subjecting the component (A) and the component (B), that is, 100 parts by weight of the prepolymer and 5 to 30 parts by weight of the diallyl bisphenol resin, to a prepolymerized reaction at 110° C. to 140° C. for 20 to 60 minutes. Preferably, a reaction time is 30-40 minutes.

For example, in one embodiment, a method of preparing the prepolymerized product comprises: obtaining the prepolymer, and then adding the diallyl bisphenol resin and performing a prepolymerization reaction under proper conditions for 30 minutes so as to obtain the prepolymerized product. In the aforesaid method of preparing the prepolymerized product, the ratio of the prepolymer and the diallyl bisphenol resin is in a range of 100:5-30.

For example, in one embodiment, the viscosity of the prepolymerized product as measured by using a rotational viscometer is preferably 300 to 1500 mPa·s (a.k.a. CPS). Generally, the viscosity of the prepolymerized product is higher than that of the prepolymer. For example, the viscosity of the prepolymer is 200 mPa·s, and the viscosity of the prepolymerized reaction product is 300 mPa·s, but not limited thereto.

For example, the cyclohexanone has a conversion rate of 50% to 95% during the preparation of the prepolymer. Unless otherwise specified, the conversion rate of the cyclohexanone may be measured according to the weight increase method. The weight increase method involves, based on the law of conservation of mass, calculating the difference in mass between the nonvolatile reactants (such as the amino-modified silicone and the maleimide resin) before prepolymerization and the prepolymer after prepolymerization, so as to calculate the mass percentage of the cyclohexanone participating in the reaction to further obtain the conversion rate of the cyclohexanone in the prepolymerization reaction.

For example, to calculate the conversion rate of the cyclohexanone, the mass of reactants is respectively measured and recorded by using an electronic scale (accurate to 0.01 gram), the reactants including nonvolatile compounds such as maleimide resin, amino-modified silicone, p-aminophenol, etc. A solution of the prepolymer is prepared from the process described above and then dried under vacuum at 120° C. for 2 hours to obtain a solid product, the mass of which is weighed and recorded. The conversion rate of cyclohexanone is calculated as below:

conversion rate of cyclohexanone=[(mass of solid product−mass of nonvolatile reactants)/mass of cyclohexanone in reactants]*100%

In one embodiment, for example, the prepolymer and the prepolymerized product are prepared by using, but not limited to, the following solvents: butanone (i.e., methyl ethyl ketone), toluene, dimethyl acetamide, methanol, ethanol, ethylene glycol monomethyl ether, acetone, methyl isobutyl ketone, xylene, methoxyethyl acetate, ethoxyethyl acetate, propoxyethyl acetate, ethyl acetate, ethylene glycol methyl ether acetate, dimethylformamide, propylene glycol monomethyl ether, and propylene glycol methyl ether acetate, which may be used alone or in combination. The amount of solvent may be determined according to the need of preparing the prepolymer or the prepolymerized product and is not particularly limited.

In one embodiment, for example, the resin composition disclosed herein may further optionally comprise a cyanate ester resin, a polyolefin resin, a small molecule vinyl compound, an acrylate resin, a phenolic resin, a polyphenylene ether resin, an epoxy resin, a benzoxazine resin, a styrene maleic anhydride resin, a polyester resin, an amine curing agent, a polyamide resin, a polyimide resin, or a combination thereof.

The cyanate ester resin used herein may include any known cyanate ester resins used in the art, including but not limited to a cyanate ester resin with an Ar—O—C≡N structure (wherein Ar represents an aromatic group, such as benzene, naphthalene or anthracene), a phenol novolac cyanate ester resin, a bisphenol A cyanate ester resin, a bisphenol A novolac cyanate ester resin, a bisphenol F cyanate ester resin, a bisphenol F novolac cyanate ester resin, a dicyclopentadiene-containing cyanate ester resin, a naphthalene-containing cyanate ester resin, a phenolphthalein cyanate ester resin, or a combination thereof. Examples of the cyanate ester resin include but are not limited to Primaset PT-15, PT-30S, PT-60S, BA-200, BA-230S, BA-3000S, BTP-2500, BTP-6020S, DT-4000, DT-7000, ULL950S, HTL-300, CE-320, LVT-50, or LeCy available from Lonza.

For example, the polyolefin resin used herein may include any one or more polyolefin resins useful for preparing a prepreg, a resin film, a laminate or a printed circuit board. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methylstyrene homopolymer, petroleum resin, cycloolefin copolymer and a combination thereof.

For example, the small molecule vinyl compound as used herein refers to a vinyl-containing compound with a molecular weight of less than or equal to 1000, preferably between 100 and 900 and more preferably between 100 and 800. In one embodiment, the small molecule vinyl compound may include, but not limited to, divinylbenzene, bis(vinylbenzyl) ether (BVBE), bis(vinylphenyl)ethane (BVPE), triallyl isocyanurate (TAIC), triallyl cyanurate (TAC), 1,2,4-trivinyl cyclohexane (TVCH) or a combination thereof.

For example, the acrylate resin as used herein may include, but not limited to, tricyclodecane di(meth)acrylate, tri(meth)acrylate, 1,1'-[(octahydro-4,7-methano-1H-indene-5,6-diyl)bis(methylene)]ester (e.g., SR833S, available from Sartomer) or a combination thereof.

For example, the phenolic resin used herein may be a mono-functional, bifunctional or multi-functional phenolic resin. The type of the phenolic resin is not particularly limited and may include those currently used in the field to which this disclosure pertains. Preferably, the phenolic resin is selected from a phenoxy resin, a novolac resin and a combination thereof.

For example, the polyphenylene ether resin used herein is not particularly limited and may be any one or more commercial products or a combination thereof; examples include but are not limited to dihydroxyl polyphenylene ether resin (e.g., SA90 available from SABIC), bis(vinylbenzyl) polyphenylene ether resin with a number average molecular weight of about 1200 (such as OPE-2st 1200, available from Mitsubishi Gas Chemical Co., Inc.), bis(vinylbenzyl) polyphenylene ether resin with a number average molecular weight of about 2200 (such as OPE-2st 2200, available from Mitsubishi Gas Chemical Co., Inc.), vinylbenzylated modified bisphenol A polyphenylene ether resin, methacrylic polyphenylene ether resin (e.g., SA9000 available from SABIC), amino-terminated polyphenylene ether resin, maleimide- or maleic anhydride-modified polyphenylene ether resin, vinyl-containing chain-extended polyphenylene ether resin with a number average molecular weight of about 2200 to 3000, or a combination thereof. The vinyl-containing chain-extended polyphenylene ether resin may include various polyphenylene ether resins disclosed in the US Patent Application Publication No. 2016/0185904 A1, all of which are incorporated herein by reference in their entirety.

For example, the epoxy resin described herein may be any one or more epoxy resins known in the field to which this disclosure pertains, including but not limited to bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin. The phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, the epoxy resin may be available from, but not limited to, NC-3000H (biphenyl epoxy resin) available from Nippon Kayaku, HP-7200HH (dicyclopentadiene epoxy resin) available from D.I.C. Corporation, or NPPN260 (2,6-dimethyl phenol novolac epoxy resin) available from Nan Ya Plastics Corporation.

For example, unless otherwise specified, the benzoxazine resin used in the present disclosure is not particularly limited and may include any one or more benzoxazine resins useful for making a prepreg, a resin film, a laminate or a printed circuit board. Examples include but are not limited to oxydianiline benzoxazine resin, alkenyl-containing benzoxazine resin, bisphenol A benzoxazine resin, bisphenol F benzoxazine resin, dicyclopentadiene benzoxazine resin, phenolphthalein benzoxazine resin, phosphorus-containing benzoxazine resin, and diamino benzoxazine resin. The alkenyl-containing benzoxazine resin refers to a benzoxazine resin having a carbon-carbon double bond (C=C) or a functional group derived therefrom, examples thereof including but not limited to the presence of a carbon-carbon double bond such as a vinyl group, an allyl group, a vinylbenzyl group or the like in its structure. For example, the alkenyl-containing benzoxazine resin may be allyl-modified benzoxazine resin, which may be any one or a mixture of allyl-modified bisphenol A benzoxazine resin, allyl-modified bisphenol F benzoxazine resin, allyl-modified dicyclopentadiene phenol benzoxazine resin, allyl-modified bisphenol S benzoxazine resin and diamino benzoxazine resin. The benzoxazine mixture may be for example a mixture of allyl-modified bisphenol A benzoxazine resin and allyl-modified bisphenol F benzoxazine resin; a mixture of allyl-modified dicyclopentadiene phenol benzoxazine resin and allyl-modified bisphenol S benzoxazine resin; a mixture of allyl-modified dicyclopentadiene phenol benzoxazine resin and allyl-modified bisphenol F benzoxazine resin; or a mixture of allyl-modified dicyclopentadiene phenol benzoxazine resin and allyl-modified bisphenol A benzoxazine resin. The diamino benzoxazine resin may be diaminodiphenylmethane benzoxazine resin, diaminodiphenyl sulfone benzoxazine resin, diaminodiphenyl sulfide benzoxazine resin or a combination thereof.

For example, the benzoxazine resin may include LZ-8270 (phenolphthalein benzoxazine resin), LZ-8280 (bisphenol F benzoxazine resin) or LZ-8290 (bisphenol A benzoxazine resin) available from Huntsman, PF-3500 (oxydianiline benzoxazine resin) available from Chang Chun Plastics, or HFB-2006M (phosphorus-containing benzoxazine resin) available from Showa High Polymer.

For example, the styrene maleic anhydride resin described herein may have a ratio of styrene (S) to maleic anhydride (MA) of 1:1, 2:1, 3:1, 4:1, 6:1, or 8:1, examples including but not limited to styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope. In addition, the styrene maleic anhydride resin may also be an esterified styrene maleic anhydride copolymer, such as esterified styrene maleic anhydride copolymers SMA1440, SMA17352, SMA2625, SMA3840 and SMA31890 available from Cray Valley. Unless otherwise specified, the styrene maleic anhydride resin can be added individually or as a combination to the resin composition of this disclosure.

For example, the polyester resin used herein may be obtained by esterification of an aromatic compound with two carboxylic groups and an aromatic compound with two hydroxyl groups, such as but not limited to HPC-8000, HPC-8150 or HPC-8200 available from DIC Corporation.

For example, the amine curing agent used herein may be dicyandiamide, diamino diphenyl sulfone, diamino diphenyl methane, diamino diphenyl ether, diamino diphenyl sulfide or a combination thereof, but not limited thereto.

For example, the polyamide resin used herein may be any polyamide resin known in the field to which this disclosure pertains, including but not limited to various commercially available polyamide resin products.

For example, the polyimide resin used herein may be any polyimide resin known in the field to which this disclosure pertains, including but not limited to various commercially available polyimide resin products.

In one embodiment, for example, the resin composition disclosed herein may further optionally comprise flame retardant, inorganic filler, curing accelerator, polymerization inhibitor, coloring agent, solvent, toughening agent, silane coupling agent or a combination thereof.

For example, in one embodiment, the flame retardant used herein may be any one or more flame retardants useful for preparing a prepreg, a resin film, a laminate or a printed circuit board; examples of the flame retardant include but are not limited to a phosphorus-containing flame retardant, such as any one, two or more selected from the following group: ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, diphenylphosphine oxide (DPPO) and its derivatives or resins, melamine cyanurate, tri-hydroxy ethyl isocyanurate, aluminium phosphinate (e.g., commercially available OP-930 and OP-935), or a combination thereof.

For example, the flame retardant used herein may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN), and a DOPO-containing epoxy resin, etc., wherein DOPO-PN is a DOPO-containing phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) or DOPO-BPSN (DOPO-bisphenol S novolac), etc.

For example, in one embodiment, the resin composition may further comprise an inorganic filler, such as any one or more inorganic fillers used for preparing a prepreg, a resin film, a laminate or a printed circuit board; examples include but are not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride, and calcined kaolin. Moreover, the inorganic filler can be spherical, fibrous, plate-like, particulate, flake-like or whisker-like and can be optionally pretreated by a silane coupling agent.

In one embodiment, for example, the curing accelerator (including curing initiator) suitable for the present disclosure may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butyl peroxy)-3-hexyne (25B), bis(tert-butylperoxyisopropyl)benzene or a combination thereof.

In one embodiment, for example, the polymerization inhibitor used herein is not particularly limited and may be any polymerization inhibitor known in the field to which this disclosure pertains, including but not limited to various commercially available polymerization inhibitor products. For example, the polymerization inhibitor may comprise, but not limited to, 1,1-diphenyl-2-picrylhydrazyl radical, methyl acrylonitrile, dithioester, nitroxide-mediated radical, triphenylmethyl radical, metal ion radical, sulfur radical, hydroquinone, 4-methoxyphenol, p-benzoquinone, phenothiazine, β-phenylnaphthylamine, 4-t-butylcatechol, methylene blue, 4,4'-butylidenebis (6-t-butyl-3-methylphenol), 2,2'-methylenebis(4-ethyl-6-t-butylphenol) or a combination thereof.

For example, the nitroxide-mediated radical may comprise, but not limited to, nitroxide radicals derived from cyclic hydroxylamines, such as 2,2,6,6-substituted piperidine 1-oxyl free radical, 2,2,5,5-substituted pyrrolidine 1-oxyl free radical or the like. Preferred substitutes include alkyl groups with 4 or fewer carbon atoms, such as methyl group or ethyl group. Examples of the compound containing a nitroxide radical include such as 2,2,6,6-tetramethylpiperidine 1-oxyl free radical, 2,2,6,6-tetraethylpiperidine 1-oxyl free radical, 2,2,6,6-tetramethyl-4-oxo-piperidine 1-oxyl free radical, 2,2,5,5-tetramethylpyrrolidine 1-oxyl free radical, 1,1,3,3-tetramethyl-2-isoindoline oxygen radical, N,N-di-tert-butylamine oxygen free radical and so on. Nitroxide radicals may also be replaced by using stable radicals such as galvinoxyl radicals.

The polymerization inhibitor suitable for the resin composition of the present disclosure may include products derived from the polymerization inhibitor with its hydrogen atom or group substituted by other atom or group. Examples include products derived from a polymerization inhibitor with its hydrogen atom substituted by an amino group, a hydroxyl group, a carbonyl group or the like.

In one embodiment, for example, the coloring agent suitable for the present disclosure may comprise, but not limited to, dye or pigment.

In one embodiment, for example, the purpose of adding solvent is to change the solid content of the resin composition and to adjust the viscosity of the resin composition. For example, the solvent may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

In one embodiment, for example, the purpose of adding toughening agent is to improve the toughness of the resin composition. The toughening agent may comprise, but not limited to, carboxyl-terminated butadiene acrylonitrile rubber (CTBN rubber), core-shell rubber, or a combination thereof.

In one embodiment, for example, the silane coupling agent used herein may comprise silane (such as but not limited to siloxane) and may be further categorized according to the functional groups into amino silane compound, epoxide silane compound, vinylsilane compound, acrylate silane compound, methacrylate silane compound, hydroxylsilane compound, isocyanate silane compound, methacryloxy silane compound and acryloxy silane compound.

According to the present disclosure, the resin composition of various embodiments may be processed to make different articles, such as those suitable for use as components in electronic products, including but not limited to a prepreg, a resin film, a laminate or a printed circuit board.

For example, the resin composition from each embodiment of this disclosure can be used to make a prepreg, which comprises a reinforcement material and a layered structure disposed thereon. The layered structure is formed by heating the resin composition at a high temperature to the semi-cured state (B-stage). Suitable baking temperature for making the prepreg is 130° C. to 180° C. The reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

For example, the resin composition from each embodiment of this disclosure can be used to make a resin film, which is prepared by heating and baking to semi-cure the resin composition. The resin composition may be selectively coated on a polyethylene terephthalate film (PET film), a polyimide film (PI film), a copper foil or a resin-coated copper, followed by heating and baking to semi-cure the resin composition to form the resin film. For example, but not limited to, coating the resin film on copper foil, followed by baking and heating to obtain a resin-coated copper (i.e., resin film with copper foil), wherein the resin composition on the resin-coated copper has been semi-cured.

For example, the resin composition from each embodiment of this disclosure can be used to make a laminate, which comprises two metal foils and an insulation layer disposed between the metal foils, wherein the insulation layer is made by curing the resin composition at high temperature and high pressure to the C-stage, a suitable curing temperature being for example between 230° C. and 250° C. and preferably between 235° C. and 245° C. and a suitable curing time being 80 to 180 minutes and preferably 100 to 150 minutes. The insulation layer may be formed by curing the aforesaid prepreg or resin film to the C-stage. The metal foil may comprise copper, aluminum, nickel, platinum, silver, gold or alloy thereof, such as a copper foil. Preferably, the laminate is a copper-clad laminate (CCL).

In addition, the laminate may be further processed by trace formation processes to make a circuit board, such as a printed circuit board.

According to the present disclosure, a copper foil of the resin film, laminate or printed circuit board is not particularly limited, and may be various copper foils known in the field to which this disclosure pertains, including copper circuits formed by etching or other processes. According to the present disclosure, "dispose" or "disposed" is broadly interpreted as comprising but not limited to form, arrange, locate or their synonyms.

To improve the understanding of the aforesaid articles, the embodiments and examples are described herein in conjunction with the drawings. Skilled artisans appreciate that elements in the figures are illustrated for simplicity and clarity and have not necessarily been drawn to scale. For example, the dimensions of some elements in the figures may be exaggerated relative to others to facilitate understanding of the embodiments.

Figure 3:
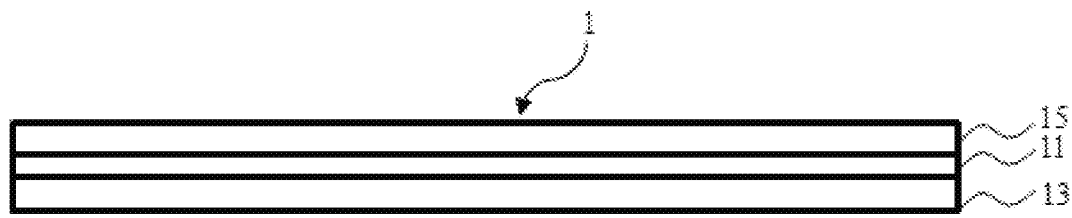
FIG. 3 illustrates an article according to one embodiment of the present disclosure.

As shown in FIG. 3, one embodiment of the present disclosure provides an article 1 primarily comprising an insulation layer 13 formed by the aforesaid resin composition and a copper foil 11 disposed on the insulation layer 13; a removable carrier 15 may be optionally provided on the copper foil 11 if needed.

In one embodiment, for example, a removable carrier 15 can be optionally disposed at the copper foil 11 on a surface opposite to the insulation layer 13, as illustrated in FIG. 3. The removable carrier 15 can be removed from the copper foil 11. Material useful for the removable carrier 15 comprises but not limited to copper foil material, aluminum foil material, copper alloy foil material, stainless steel foil material and electroplated composite metal foil material. In consideration of the easiness of recycle after peeling off, copper foil material is preferably used as the removable carrier 15.

For example, the removable carrier 15 may have a thickness of between 18 and 35 µm. Thickness of greater than or equal to 18 µm is advantageous as it may increase the post-processability. Thickness of less than or equal to 35 µm is advantageous as it may reduce the production costs. As used herein, unless otherwise specified, "removable" refers to the situation where the removable carrier 15 may be removed (e.g., peeled off) from the copper foil 11 after the article has been subjected to certain processing, such as to the conditions used for manufacturing a printed circuit board (e.g., a temperature of 80 to 235° C. and a pressure of 0.1 to 5 MPa).

For example, between the removable carrier 15 and the copper foil 11, a releasing resin layer may be optionally arranged; suitable material for the releasing resin layer may be readily selected by a person having ordinary skill in the art without undue experimentation by reference to prior arts.

In order to improve the removal efficiency, a bonding interface layer can be optionally arranged between the removable carrier 15 and the copper foil 11. The type of the aforesaid bonding interface layer is not particularly limited, as long as it may provide suitable adhesion between the copper foil 11 and the removable carrier 15. The bonding interface layer may be made of metal, such as chromium, lead, silver, zinc or nickel; alternatively, oxide of these metal, sulfide thereof (e.g., sodium sulfide, ammonium sulfide and copper sulfide), and chromate thereof may be used as an inorganic bonding interface layer. On the other hand, nitride, sulfide, organic compound and carboxylic acid can be used as an organic bonding interface layer, and inorganic compound can be used as an inorganic bonding interface layer. Suitable materials for the organic bonding interface layer and the inorganic bonding interface layer may be readily selected by a person having ordinary skill in the art without undue experimentation by reference to prior arts.

According to the present disclosure, for example, the copper foil 11 may be selected as a copper foil with a thickness of less than or equal to 35 μm, such as a copper foil with a thickness of between 12 and 35 μm (abbreviated as ordinary copper foil), such as ordinary copper foils with a thickness of 12, 18, or 35 μm, but not limited thereto. For example, surface roughness of the ordinary copper foil (abbreviated as Rz) is not particularly limited, such as but not limited to ordinary copper foils with a surface roughness ranging from 2.0 to 6.5 μm, such as ordinary copper foils with a surface roughness of 2.0, 3.0, 4.2, 4.5, or 6.5 μm, but not limited thereto.

In particular, the copper foil 11 is preferably an ultra-thin copper foil, i.e., a copper foil with a thickness of less than or equal to 6 μm. For example, the thickness may be between 0.5 μm and 6 μm, such as 0.5 μm, 1 μm, 2 μm, 3 μm, 4 μm, 5 μm or 6 μm, but not limited thereto, such as between 0.5 μm and 3 μm or between 3 μm and 6 μm. An ultra-thin copper foil with a thickness of less than or equal to 6 μm may improve the formation of high precision circuit, and an ultra-thin copper foil with a thickness of greater than or equal to 0.5 μm may prevent both the copper foil 11 and the removable carrier 15 from being peeled off or inhibit the formation of poor circuits, thereby increasing the yield rate of the process and effectively avoiding breakage of the circuits. For example, the surface roughness (abbreviated as Rz) of the ultra-thin copper foil may be between 1.0 μm and 1.5 μm, such as 1.0, 1.1, 1.2, 1.3, 1.4, or 1.5 μm, but not limited thereto.

According to the present disclosure, unless otherwise specified, a proper roughness can be formed on the surface of the copper foil 11 to promote the bonding with the insulation layer 13. Specific roughness increasing methods or bonding improving methods for ultra-thin copper foils can be referred from those employed for treating ordinary copper foils or from physical or chemical roughening methods known in the art.

Generally, the copper foil peeling strength varies with the choice of copper foil thickness. The industry generally believes that the copper foil peeling strength tested under the same conditions, such as testing the ultra-thin copper foil peeling strength and the ordinary copper foil peeling strength, usually electroplates the obtained ultra-thin copper foil samples, such that the copper thickness of the electroplated ultra-thin copper foil samples and the copper thickness of the tested ordinary copper foil peeling strength are the same. In this case, the peeling strength of the ultra-thin copper foil is usually comparatively much lower than that of the ordinary copper foil. In this case, the resin composition cannot be used in fine traces and narrow spacing printed circuit boards, which results in poor adhesion between the ultra-thin copper foils and the resin of insulation layers and accompanying problems such as circuit peeling off. For example, in the present disclosure, the peeling strength of the ultra-thin copper foil (the thickness of the copper foil is less than or equal to 6 μm) is much greater than that of the ordinary copper foil (the thickness of the copper foil is between 12 μm and 35 μm), which is mainly due to the synergistic result of the resin composition and the selected copper foil.

Figure 4:
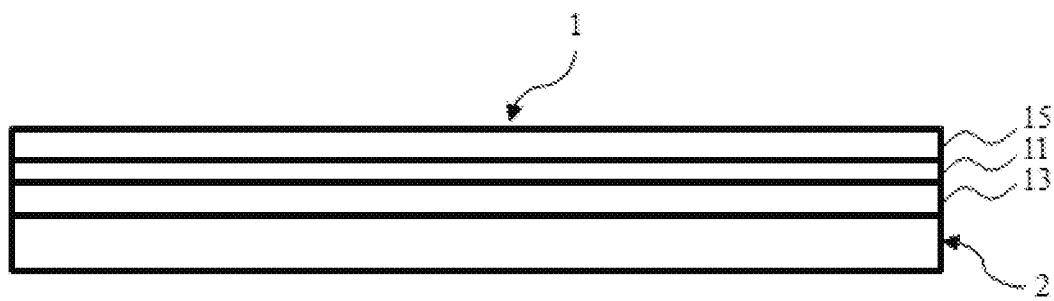
FIG. 4 illustrates an article according to another embodiment of the present disclosure.
Figure 5:
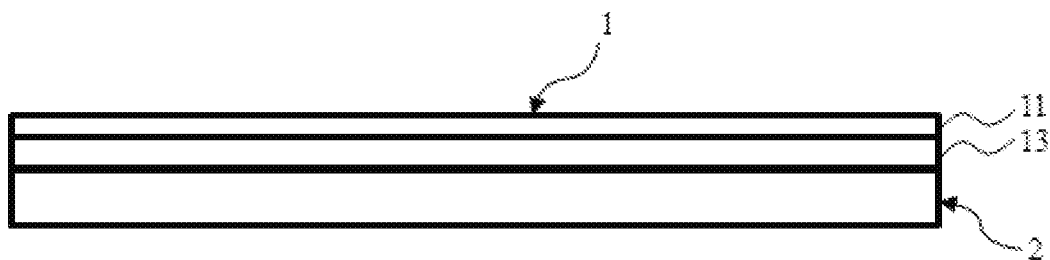
FIG. 5 illustrates an article according to another embodiment of the present disclosure.

In addition, for example, as shown in FIG. 4, the article 1 may be stacked on a substrate 2 (inner circuit substrate) prepared by known processes, so as to join the insulation layer 13 of the article 1 with the surface of the substrate 2 to form a stack. Next, conventional lamination conditions in the art may be used to perform high temperature lamination to cure the insulation layer 13. After that, as illustrated in FIG. 5, if the article 1 is provided with a removable carrier 15, then the removable carrier 15 may be peeled off from the article 1 and the article 1 is then processed by known circuit board processes to form a printed circuit board.

For example, the resin composition disclosed herein or the article made therefrom achieves improvement in one or more of the following properties: glass transition temperature, ordinary copper foil peeling strength, ultra-thin copper foil peeling strength, and X-axis coefficient of thermal expansion.

For example, the resin composition according to the present disclosure or the article made therefrom may achieve one, more or all of the following properties:

a glass transition temperature as measured by using dynamic mechanical analysis by reference to IPC-TM-650 2.4.24.4 of greater than or equal to 284° C., such as between 284° C. and 342° C.;

an X-axis coefficient of thermal expansion as measured by reference to IPC-TM-650 2.4.24.5 of less than or equal to 7.6 ppm/° C., such as between 6.0 ppm/° C. and 7.6 ppm/° C.;

a higher copper foil peeling strength as measured by reference to IPC-TM-650 2.4.8;

for example, the copper foil peeling strength of an ordinary copper foil having a thickness of greater than or equal to 35 μm (such as a 1-ounce reverse treatment copper foil) is greater than or equal to 4.5 lb/in, such as between 4.5 lb/in and 5.2 lb/in; for example, the copper foil peeling strength of an ultra-thin copper foil having a thickness of less than or equal to 3 μm is greater than or equal to 5.0 lb/in, such as between 5.0 lb/in and 6.9 lb/in.

Raw materials below are used to prepare the Prepolymer or Prepolymerized Product Preparation Examples and Prepolymer or Prepolymerized Product Comparative Preparation Examples of the present disclosure according to the amount listed in Table 1 to Table 4, and prepare the resin compositions of various Examples and Comparative Examples of the present disclosure according to the amount listed in Table 5 to Table 9 and further fabricated to prepare test samples or articles.

BMI-80: aromatic bismaleimide resin, available from K.I Chemical Industry Co., Ltd.

BMI-2300: phenylmethane maleimide oligomer, available from Daiwa Fine Chemicals Co., Ltd.

BMI-70: aromatic bismaleimide resin, available from K.I Chemical Industry Co., Ltd.

X-22-161A: amino-modified silicone, having an amino equivalent of 800 g/mol, available from Shin-Etsu Chemical Co., Ltd.

X-22-161B: amino-modified silicone, having an amino equivalent of 1500 g/mol, available from Shin-Etsu Chemical Co., Ltd.
KF-8012: amino-modified silicone, having an amino equivalent of 2200 g/mol, available from Shin-Etsu Chemical Co., Ltd.
KF-8010: amino-modified silicone, having an amino equivalent of 430 g/mol, available from Shin-Etsu Chemical Co., Ltd.
KF-8008: amino-modified silicone, having an amino equivalent of 5700 g/mol, available from Shin-Etsu Chemical Co., Ltd.
Cyclohexanone: boiling point 155° C., commercially available.
p-aminophenol: available from Shanghai Aladdin Bio-Chem Technology Co., Ltd. DMAC: dimethyl acetamide, boiling point 164 to 166° C., available from Sinopec Group.
PM: propylene glycol monomethyl ether, boiling point 118 to 119° C., commercially available.
EGMEA: ethylene glycol methyl ether acetate, boiling point 145° C., commercially available.
PMA: propylene glycol methyl ether acetate, boiling point 146 to 154° C., commercially available.
Diallyl bisphenol A: as shown by Formula (III), available from Sichuan EM Technology Co., Ltd.

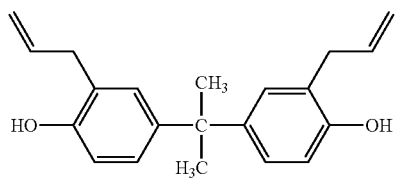

Formula (III)

Diallyl bisphenol F: as shown by Formula (IV), commercially available.

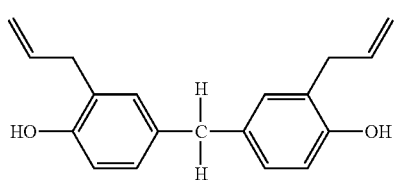

Formula (IV)

Diallyl bisphenol S: as shown by Formula (V), available from Shanghai Macklin Biochemical Co., Ltd.

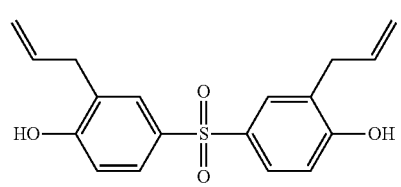

(Formula V)

DAIP: diallyl isophthalate, commercially available.
Bisphenol A: commercially available.
Silica A: spherical silica treated by amino-containing silane coupling agent, having a particle size distribution D50 of 0.4 to 0.6 μm, available from Admatechs Company Limited.
2PZ: 2-phenylimidazole, available from Shikoku Chemicals Corp.
MEK: methyl ethyl ketone, boiling point 75.6° C., commercially available.

In the Tables, "Z" represents the total amount of components excluding (i.e., not containing) inorganic filler and solvent in the resin composition of each Example or each Comparative Example. In the Tables, "Z*1" represents the amount of inorganic filler is 1.0 time of "Z". For example, in Example E1, "Z*1" represents that the amount of inorganic filler is 105 parts by weight (105 parts by weight multiplied by 1.0).

The amount of methyl ethyl ketone, dimethyl acetamide and propylene glycol methyl ether acetate is shown as "PA" in the Tables to indicate a "proper amount" to represent an amount of solvents used to achieve a desirable solid content of the whole resin composition. For a resin composition comprises methyl ethyl ketone, dimethyl acetamide and propylene glycol methyl ether acetate, "PA" represents the total amount of the three solvents used to achieve a desirable solid content of the whole resin composition, such as but not limited to a 60 wt % solid content.

Preparation of Prepolymer

As an example, in Prepolymer Preparation Example 1, 80 parts by weight of a maleimide resin (BMI-80) and 5 parts by weight of cyclohexanone were added to a closed stirring reaction vessel containing 100 parts by weight of a solvent propylene glycol methyl ether acetate (i.e., PMA), the temperature was increased to 110° C. with stirring for 15 minutes to dissolve the maleimide resin, followed by adding 15 parts by weight of an amino-modified silicone (X-22-161B) and increasing the temperature to 120° C. and stirring and reacting for 2 hours, so as to obtain a solution of the product (prepolymer of maleimide resin, amino-modified silicone and cyclohexanone) of Prepolymer Preparation Example 1.

By reference to the process of Prepolymer Preparation Example 1, a maleimide resin and cyclohexanone were added to a solvent according to the amount in Table 1 to Table 4, stirring at 110° C. for 15 minutes to dissolve the maleimide resin, and adding an amino-modified silicone, followed by increasing the temperature to 120° C. and stirring and reacting for 2 hours, so as to obtain the product solution of Prepolymer Preparation Examples 2-12 and Prepolymer Comparative Preparation Examples 1-6, 13 and 14, respectively.

In Prepolymer Comparative Preparation Example 7, a maleimide resin and an amino-modified silicone were added to a solvent, the temperature was increased to 110° C. with stirring for 15 minutes to dissolve the maleimide resin, followed by increasing the temperature to 120° C. and stirring and reacting for 2 hours, so as to obtain a product solution of Prepolymer Comparative Preparation Example 7.

In Prepolymer Comparative Preparation Examples 8 and 9, a maleimide resin, an amino-modified silicone and p-aminophenol were added to a solvent, the temperature was increased to 110° C. with stirring for 15 minutes to dissolve the maleimide resin, followed by increasing the temperature to 120° C. and stirring and reacting for 2 hours, so as to obtain a product solution of Prepolymer Comparative Preparation Examples 8 and 9.

In Prepolymer Comparative Preparation Example 10 or 11, a maleimide resin and dimethyl acetamide or propylene glycol monomethyl ether were added to a solvent, the temperature was increased to 110° C. with stirring for 15 minutes to dissolve the maleimide resin, followed by adding an amino-modified silicone and then increasing the temperature to 120° C. and stirring and reacting for 2 hours, so as to obtain a product solution of Prepolymer Comparative Preparation Example 10 or 11.

In Prepolymer Comparative Preparation Example 12, 78 parts by weight of a maleimide resin (BMI-2300) and 2 parts by weight of cyclohexanone were added to a closed stirring reaction vessel containing 100 parts by weight of cyclohexanone, the temperature was increased to 110° C. with stirring for 15 minutes to dissolve the maleimide resin, followed by adding 20 parts by weight of an amino-modified silicone (X-22-161B) and increasing the temperature to 120° C. and stirring and reacting for 2 hours, so as to obtain a product solution of Prepolymer Comparative Preparation Example 12.

Preparation of Prepolymerized Product

In Preparation Example 13, 78 parts by weight of a maleimide resin (BMI-80) and 2 parts by weight of cyclohexanone were added to a closed stirring reaction vessel containing 100 parts by weight of a solvent propylene glycol methyl ether acetate (i.e., PMA), the temperature was increased to 110° C. with stirring for 15 minutes to dissolve the maleimide resin, followed by adding 20 parts by weight of an amino-modified silicone (X-22-161B) and increasing the temperature to 120° C. and stirring and reacting for 2 hours, so as to obtain a prepolymer. 5 parts by weight of diallyl bisphenol A was added to the prepolymer and the reaction was carried out at 120° C. for 30 minutes under stirring, so as to obtain a solution of the prepolymerized product of Preparation Example 13 (i.e., the prepolymerized product of component (A) and component (B) of the present disclosure).

By reference to the process of Preparation Example 13, a maleimide resin and cyclohexanone were added to a solvent according to the amount in Table 2, stirring at 110° C. for 15 minutes to dissolve the maleimide resin, and adding an amino-modified silicone, followed by increasing the temperature to 120° C. and stirring and reacting for 2 hours, so as to obtain a prepolymer. Diallyl bisphenol A was added to the prepolymer and the reaction was carried out at 120° C. for 30 minutes under stirring, so as to obtain a solution of the prepolymerized product of Preparation Example 14.

In Comparative Preparation Example 15, a maleimide resin was added to a solvent, the temperature was increased to 110° C. with stirring for 15 minutes to dissolve the maleimide resin, and adding an amino-modified silicone, followed by increasing the temperature to 120° C., and stirring and reacting for 2 hours. Diallyl bisphenol A was then added and the reaction was carried out at 120° C. for 30 minutes under stirring, so as to obtain a solution of the prepolymerized product of Comparative Preparation Example 15.

In Comparative Preparation Example 16, a maleimide resin was added to a solvent, the temperature was increased to 110° C. with stirring for 15 minutes to dissolve the maleimide resin, followed by increasing the temperature to 120° C. with stirring for 2 hours. Diallyl bisphenol A was then added and the reaction was carried out at 120° C. for 30 minutes under stirring, so as to obtain a solution of the prepolymerized product of Comparative Preparation Example 16.

Preparation of Unprepolymerized Mixture

In addition, 78 parts by weight of a maleimide resin (BMI-80) and 2 parts by weight of cyclohexanone were added to a closed stirring reaction vessel containing 100 parts by weight of a solvent propylene glycol methyl ether acetate, followed by adding 20 parts by weight of an amino-modified silicone (X-22-161B) and then stirring and mixing to obtain Mixture A, which was dried under vacuum at 120° C. for 2 hours to obtain a dried Mixture A (i.e., Mixture B).

Fourier-Transform Infrared (FTIR) Spectroscopy of Prepolymer

The product solution of Prepolymer Preparation Example 2 prepared from maleimide resin, amino-modified silicone and cyclohexanone was dried under vacuum at 120° C. for 2 hours to obtain its solid from which the solvent was completely removed. FTIR spectra were tested for the solid product of Prepolymer Preparation Example 2, the reactants including maleimide resin, amino-modified silicone and cyclohexanone and the solvent PMA, as illustrated in FIG. 1, showing from top to bottom the FTIR spectra of PMA, cyclohexanone, maleimide resin, amino-modified silicone and the product of Prepolymer Preparation Example 2, respectively. It can be observed that, in the FTIR spectrum of cyclohexanone, a —$CH_2$— out-of-plane bending vibration absorption peak at 1310 $cm^{-1}$ represents the unique absorption peak of cyclohexanone. An absorption peak also appears at 1310 $cm^{-1}$ in the FTIR spectrum of the product of Prepolymer Preparation Example 2, indicating that cyclohexanone participates in the prepolymerization reaction.

Figure 2:
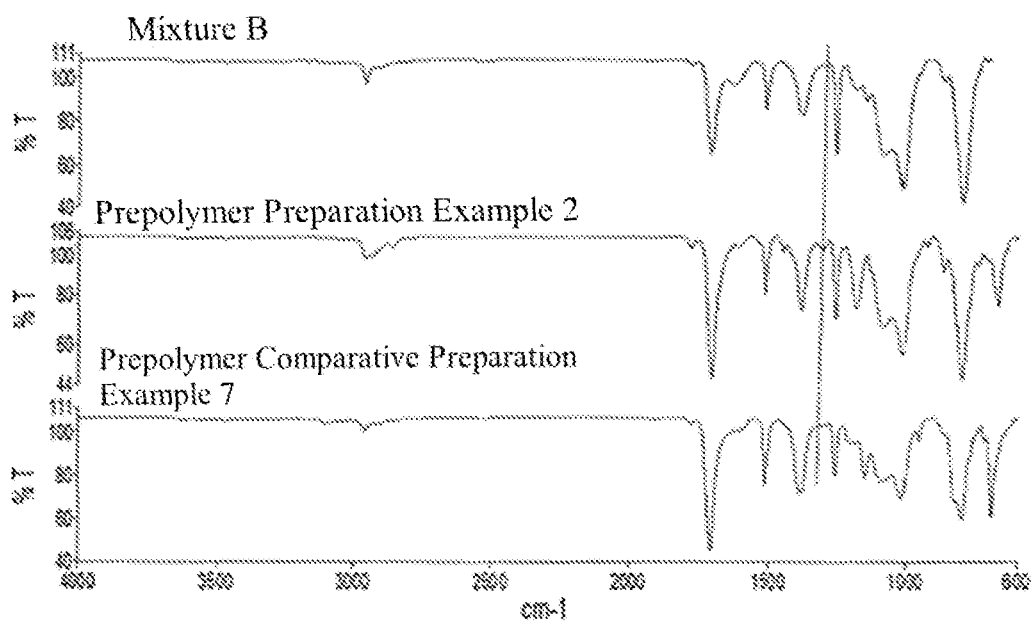
FIG. 2 illustrates the FTIR spectrum of the product of Prepolymer Preparation Example 2, the product of Prepolymer Comparative Preparation Example 7 and Mixture B.

The product solution of Prepolymer Comparative Preparation Example 7 was dried under vacuum at 120° C. for 2 hours to obtain its solid from which the solvent was completely removed. FTIR spectra were tested for the solid product of Prepolymer Preparation Example 2, the solid product of Prepolymer Comparative Preparation Example 7 and Mixture B, as illustrated in FIG. 2, showing from top to bottom the FTIR spectra of Mixture B, solid product of Prepolymer Preparation Example 2 and solid product of Prepolymer Comparative Preparation Example 7, respectively. It can be observed that the absorption peak at 1310 $cm^{-1}$ (i.e., the unique absorption peak of cyclohexanone) appears only in the FTIR spectrum of the solid product of Prepolymer Preparation Example 2 and not in other FTIR spectra, indicating significant difference in structure or functional group of the products of Mixture B, Prepolymer Comparative Preparation Example 7 and Prepolymer Preparation Example 2, which further validates that cyclohexanone participates in the prepolymerization reaction of Prepolymer Preparation Example 2.

Calculation of Conversion Rate of Cyclohexanone

To calculate the conversion rate of cyclohexanone in the prepolymer, the mass of reactants was respectively measured and recorded by using an electronic scale (accurate to 0.01 gram), the reactants including nonvolatile compounds such as maleimide resin, amino-modified silicone or p-aminophenol. The solution from each of Prepolymer Preparation Examples 1-14 and Prepolymer Comparative Preparation Examples 1-16 was dried under vacuum at 120° C. for 2 hours to obtain a solid, which was weighed and recorded as the mass of the product (solid state). The conversion rate of cyclohexanone was calculated as below and listed in Table 1 to Table 4.

conversion rate of cyclohexanone=[(mass of solid product−mass of nonvolatile reactants)/mass of cyclohexanone in reactants]*100%

Compatibility of Prepolymer

The solution from each of Prepolymer or Prepolymerized Product Preparation Examples 1-14 (PET to PE14) and Comparative Preparation Examples 1-16 (CPE1 to CPE16)

was loaded to a transparent volumetric flask and sealed, and then stood still at room temperature for 24 hours to observe the compatibility of the solution by visual inspection. If the solution is homogeneous without phase separation, a designation of "H" is given to represent homogeneous; if layer separation or phase separation is observed from the solution, a designation of "S" is given to represent phase separation. Test results are listed in Table 1 to Table 4 below.

TABLE 1

Compositions and test results of Prepolymer or Prepolymerized Product Preparation Examples

| Component | PE1 | PE2 | PE3 | PE4 | PE5 | PE6 | PE7 |
|---|---|---|---|---|---|---|---|
| BMI-80 | 80 | 78 | 73 | 60 | 68 | | |
| BMI-2300 | | | | | | 78 | |
| BMI-70 | | | | | | | 78 |
| X-22-161A | | | | | | | |
| X-22-161B | 15 | 20 | 20 | 25 | 30 | 20 | 20 |
| KF-8012 | | | | | | | |
| KF-8010 | | | | | | | |
| KF-8008 | | | | | | | |
| cyclohexanone | 5 | 2 | 7 | 15 | 2 | 2 | 2 |
| diallyl bisphenol A | | | | | | | |
| p-aminophenol | | | | | | | |
| DMAC | | | | | | | |
| PM | | | | | | | |
| EGMEA | | | | | | | |
| PMA | 100 | 100 | 100 | 100 | 100 | 100 | 100 |
| parts by weight of product | 99.00 | 99.90 | 98.00 | 92.50 | 99.90 | 99.90 | 99.90 |
| conversion rate of cyclohexanone | 80.00% | 95.00% | 71.43% | 50.00% | 95.00% | 95.00% | 95.00% |
| phase state after standing for 24 hours | H | H | H | H | H | H | H |

TABLE 2

Compositions and test results of Prepolymer or Prepolymerized Product Preparation Examples

| Component | PE8 | PE9 | PE10 | PE11 | PE12 | PE13 | PE14 |
|---|---|---|---|---|---|---|---|
| BMI-80 | | 78 | 78 | 78 | 78 | 78 | 78 |
| BMI-2300 | | | | | | | |
| BMI-70 | 67 | | | | | | |
| X-22-161A | | 20 | | | | | |
| X-22-161B | 30 | | | 20 | 20 | 20 | 20 |
| KF-8012 | | | 20 | | | | |
| KF-8010 | | | | | | | |
| KF-8008 | | | | | | | |
| cyclohexanone | 3 | 2 | 2 | 2 | 2 | 2 | 2 |
| diallyl bisphenol A | | | | | | 5 | 30 |
| p-aminophenol | | | | | | | |
| DMAC | | | | | | | |
| PM | | | | 100 | | | |
| EGMEA | | | | | 30 | | |
| PMA | 100 | 100 | 100 | | 70 | 100 | 100 |
| parts by weight of product | 99.70 | 99.90 | 99.84 | 99.70 | 99.80 | 99.90 | 99.90 |
| conversion rate of cyclohexanone | 90.00% | 95.00% | 92.00% | 85.00% | 90.00% | 95.00% | 95.00% |
| phase state after standing for 24 hours | H | H | H | H | H | H | H |

TABLE 3

Compositions and test results of Prepolymer or Prepolymerized Product Comparative Preparation Examples

| Component | CPE1 | CPE2 | CPE3 | CPE4 | CPE5 | CPE6 | CPE7 | CPE8 |
|---|---|---|---|---|---|---|---|---|
| BMI-80 | 83 | 55 | 60 | 75 | 79 | 60 | 78 | |
| BMI-2300 | | | | | | | | |
| BMI-70 | | | | | | | | 67 |
| X-22-161A | | | | | | | | |
| X-22-161B | 15 | 30 | 35 | 10 | 20 | 20 | 22 | |

TABLE 3-continued

Compositions and test results of Prepolymer or Prepolymerized Product
Comparative Preparation Examples

| Component | CPE1 | CPE2 | CPE3 | CPE4 | CPE5 | CPE6 | CPE7 | CPE8 |
|---|---|---|---|---|---|---|---|---|
| KF-8012 | | | | | | | | 30 |
| KF-8010 | | | | | | | | |
| KF-8008 | | | | | | | | |
| cyclohexanone | 2 | 15 | 5 | 15 | 1 | 20 | | |
| diallyl bisphenol A | | | | | | | | |
| p-aminophenol | | | | | | | | 3 |
| DMAC | | | | | | | | |
| PM | | | | | | | | |
| EGMEA | | | | | | | | |
| PMA | 100 | 100 | 100 | 100 | 100 | 100 | 100 | 100 |
| parts by weight of product | 99.92 | 92.20 | 98.60 | 92.00 | 99.96 | 89.00 | 100.00 | 100.00 |
| conversion rate of cyclohexanone | 96.00% | 48.00% | 72.00% | 46.67% | 96.00% | 45.00% | / | / |
| phase state after standing for 24 hours | S | H | H | S | S | H | S | S |

TABLE 4

Compositions and test results of Prepolymer or Prepolymerized Product
Comparative Preparation Examples

| Component | CPE9 | CPE10 | CPE11 | CPE12 | CPE13 | CPE14 | CPE15 | CPE16 |
|---|---|---|---|---|---|---|---|---|
| BMI-80 | | 78 | 78 | | 78 | 78 | 78 | 100 |
| BMI-2300 | | | | 78 | | | | |
| BMI-70 | 67 | | | | | | | |
| X-22-161A | | | | | | | | |
| X-22-161B | | 20 | 20 | 20 | | | 22 | |
| KF-8012 | | | | | | | | |
| KF-8010 | 30 | | | | 20 | | | |
| KF-8008 | | | | | | 20 | | |
| cyclohexanone | | | | 102 | 2 | 2 | | |
| diallyl bisphenol A | | | | | | | 5 | 5 |
| p-aminophenol | 3 | | | | | | | |
| DMAC | | 2 | | | | | | |
| PM | | | 2 | | | | | |
| EGMEA | | | | | | | | |
| PMA | 100 | 100 | 100 | | 100 | 100 | 100 | 100 |
| parts by weight of product | 100.00 | 98.00 | 98.00 | 110.00 | 99.96 | 99.76 | 100.00 | 100.00 |
| conversion rate of cyclohexanone | / | / | / | 11.76% | 98.00% | 88.00% | / | / |
| phase state after standing for 24 hours | S | S | S | H | H | S | S | H |

In addition, Mixture A was loaded to a transparent volumetric flask and sealed and then stood still at room temperature for 24 hours. By visual inspection, layer separation and phase separation were observed from the solution, which was designated as "S" to represent phase separation.

Mixture A was dried under vacuum at 120° C. for 2 hours to obtain a dried Mixture A (i.e., Mixture B). Mixture B was weighed to obtain the amount of Mixture B as 98 parts by weight, which is the same as the total mass of nonvolatile reactants in Mixture A, i.e., 78 parts by weight of maleimide resin and 20 parts by weight of amino-modified silicone; accordingly, it can be inferred that the conversion rate of cyclohexanone in Mixture A is 0.0000.

Compositions and test results of resin compositions of Examples and Comparative Examples are listed below (in part by weight):

TABLE 5

Resin compositions of Examples (in part by weight) and test results

| | Component | E1 | E2 | E3 | E4 | E5 | E6 | E7 | E8 | E9 |
|---|---|---|---|---|---|---|---|---|---|---|
| prepolymer | PE1 | 100 | | | | | | | | |
| | PE2 | | 100 | | | | | | | |
| | PE3 | | | 100 | | | | | | |
| | PE4 | | | | 100 | | | | | |

TABLE 5-continued

Resin compositions of Examples (in part by weight) and test results

| Component | | E1 | E2 | E3 | E4 | E5 | E6 | E7 | E8 | E9 |
|---|---|---|---|---|---|---|---|---|---|---|
| | PE5 | | | | | 100 | | | | |
| | PE6 | | | | | | 100 | | | |
| | PE7 | | | | | | | 100 | | |
| | PE8 | | | | | | | | 100 | |
| | PE9 | | | | | | | | | 100 |
| | PE10 | | | | | | | | | |
| | PE11 | | | | | | | | | |
| | PE12 | | | | | | | | | |
| prepolymerized product | PE13 | | | | | | | | | |
| | PE14 | | | | | | | | | |
| diallyl bisphenol resin | diallyl bisphenol A | 5 | 5 | 5 | 5 | 5 | 5 | 5 | 5 | 5 |
| | diallyl bisphenol F | | | | | | | | | |
| | diallyl bisphenol S | | | | | | | | | |
| maleimide resin | BMI-80 | | | | | | | | | |
| amino-modified silicone | X-22-161B | | | | | | | | | |
| cyclohexanone | cyclohexanone | | | | | | | | | |
| diallyl resin | DAIP | | | | | | | | | |
| phenolic resin | bisphenol A | | | | | | | | | |
| inorganic filler | Silica A | Z*1 | Z*1 | Z*1 | Z*1 | Z*1 | Z*1 | Z*1 | Z*1 | Z*1 |
| curing accelerator | 2PZ | 0.5 | 0.5 | 0.5 | 0.5 | 0.5 | 0.5 | 0.5 | 0.5 | 0.5 |
| solvent (Sc = 60%) | MEK | PA | PA | PA | PA | PA | PA | PA | PA | PA |
| | DMAC | PA | PA | PA | PA | PA | PA | PA | PA | PA |
| | PMA | PA | PA | PA | PA | PA | PA | PA | PA | PA |
| Property test | Unit | E1 | E2 | E3 | E4 | E5 | E6 | E7 | E8 | E9 |
| glass transition temperature | ° C. | 332 | 324 | 316 | 292 | 304 | 342 | 302 | 286 | 322 |
| ordinary copper foil peeling strength | lb/in | 4.9 | 4.9 | 4.8 | 4.7 | 4.7 | 4.6 | 4.9 | 4.5 | 5.1 |
| ultra-thin copper foil peeling strength | lb/in | 6.2 | 5.6 | 5.7 | 5.1 | 5.2 | 5.1 | 5.3 | 5.0 | 5.7 |
| coefficient of thermal expansion | ppm/° C. | 7.2 | 6.6 | 6.6 | 6.4 | 6.0 | 6.2 | 6.4 | 6.6 | 6.7 |

TABLE 6

Resin compositions of Examples (in part by weight) and test results

| Component | | E10 | E11 | E12 | E13 | E14 | E15 | E16 | E17 | E18 | E19 |
|---|---|---|---|---|---|---|---|---|---|---|---|
| prepolymer | PE1 | | | | | | | | | | |
| | PE2 | | | | | | 100 | 100 | 100 | 100 | 100 |
| | PE3 | | | | | | | | | | |
| | PE4 | | | | | | | | | | |
| | PE5 | | | | | | | | | | |
| | PE6 | | | | | | | | | | |
| | PE7 | | | | | | | | | | |
| | PE8 | | | | | | | | | | |
| | PE9 | | | | | | | | | | |
| | PE10 | 100 | | | | | | | | | |
| | PE11 | | 100 | | | | | | | | |
| | PE12 | | | 100 | | | | | | | |
| prepolymerized product | PE13 | | | | 105 | | | | | | |
| | PE14 | | | | | 130 | | | | | |
| diallyl bisphenol resin | diallyl bisphenol A | 5 | 5 | 5 | | | 5 | 20 | 30 | | |
| | diallyl bisphenol F | | | | | | | | | 5 | |
| | diallyl bisphenol S | | | | | | 5 | | | | 5 |
| maleimide resin | BMI-80 | | | | | | | | | | |
| amino-modified silicone | X-22-161B | | | | | | | | | | |
| cyclohexanone | cyclohexanone | | | | | | | | | | |
| diallyl resin | DAIP | | | | | | | | | | |
| phenolic resin | bisphenol A | | | | | | | | | | |
| inorganic filler | Silica A | Z*1 | Z*1 | Z*1 | Z*1 | Z*1 | Z*1 | Z*1 | Z*1 | Z*1 | Z*1 |
| curing accelerator | 2PZ | 0.5 | 0.5 | 0.5 | 0.5 | 0.5 | 0.5 | 0.5 | 0.5 | 0.5 | 0.5 |
| solvent (Sc = 60%) | MEK | PA | PA | PA | PA | PA | PA | PA | PA | PA | PA |
| | DMAC | PA | PA | PA | PA | PA | PA | PA | PA | PA | PA |
| | PMA | PA | PA | PA | PA | PA | PA | PA | PA | PA | PA |
| Property test | Unit | E10 | E11 | E12 | E13 | E14 | E15 | E16 | E17 | E18 | E19 |
| glass transition temperature | ° C. | 312 | 327 | 322 | 325 | 286 | 327 | 298 | 284 | 320 | 330 |
| ordinary copper foil peeling strength | lb/in | 5.2 | 4.8 | 5.1 | 4.8 | 5.1 | 5.1 | 4.9 | 5.0 | 4.9 | 5.1 |
| ultra-thin copper foil peeling strength | lb/in | 6.0 | 5.5 | 5.8 | 5.7 | 6.9 | 5.8 | 6.3 | 6.7 | 5.6 | 5.8 |

TABLE 6-continued

Resin compositions of Examples (in part by weight) and test results

| Component | | E10 | E11 | E12 | E13 | E14 | E15 | E16 | E17 | E18 | E19 |
|---|---|---|---|---|---|---|---|---|---|---|---|
| coefficient of thermal expansion | ppm/° C. | 7.1 | 6.5 | 6.6 | 6.6 | 7.6 | 6.9 | 7.2 | 7.6 | 6.6 | 6.7 |

TABLE 7

Resin compositions of Comparative Examples (in part by weight) and test results

| Component | | C1 | C2 | C3 | C4 | C5 | C6 | C7 | C8 |
|---|---|---|---|---|---|---|---|---|---|
| prepolymer | PE1 | | | | | | | | |
| | PE2 | | | | | | | | |
| | PE3 | | | | | | | | |
| | PE4 | | | | | | | | |
| | PE5 | | | | | | | | |
| | PE6 | | | | | | | | |
| | PE7 | | | | | | | | |
| | PE8 | | | | | | | | |
| | PE9 | | | | | | | | |
| | PE10 | | | | | | | | |
| | PE11 | | | | | | | | |
| | PE12 | | | | | | | | |
| prepolymerized product | PE13 | | | | | | | | |
| | PE14 | | | | | | | | |
| prepolymer | CPE1 | 100 | | | | | | | |
| | CPE2 | | 100 | | | | | | |
| | CPE3 | | | 100 | | | | | |
| | CPE4 | | | | 100 | | | | |
| | CPE5 | | | | | 100 | | | |
| | CPE6 | | | | | | 100 | | |
| | CPE7 | | | | | | | 100 | |
| | CPE8 | | | | | | | | 100 |
| | CPE9 | | | | | | | | |
| | CPE10 | | | | | | | | |
| | CPE11 | | | | | | | | |
| | CPE12 | | | | | | | | |
| | CPE13 | | | | | | | | |
| | CPE14 | | | | | | | | |
| prepolymerized product | CPE15 | | | | | | | | |
| | CPE16 | | | | | | | | |
| diallyl bisphenol resin | diallyl bisphenol A | 5 | 5 | 5 | 5 | 5 | 5 | 5 | 5 |
| | diallyl bisphenol F | | | | | | | | |
| | diallyl bisphenol S | | | | | | | | |
| maleimide resin | BMI-80 | | | | | | | | |
| amino-modified silicone | X-22-161B | | | | | | | | |
| cyclohexanone | cyclohexanone | | | | | | | | |
| diallyl resin | DAIP | | | | | | | | |
| phenolic resin | bisphenol A | | | | | | | | |
| inorganic filler | Silica A | Z * 1 | Z * 1 | Z * 1 | Z * 1 | Z * 1 | Z * 1 | Z * 1 | Z * 1 |
| curing accelerator | 2PZ | 0.5 | 0.5 | 0.5 | 0.5 | 0.5 | 0.5 | 0.5 | 0.5 |
| solvent (Sc = 60%) | MEK | PA | PA | PA | PA | PA | PA | PA | PA |
| | DMAC | PA | PA | PA | PA | PA | PA | PA | PA |
| | PMA | PA | PA | PA | PA | PA | PA | PA | PA |
| Property test | Unit | C1 | C2 | C3 | C4 | C5 | C6 | C7 | C8 |
| glass transition temperature | ° C. | 341 | 267 | 270 | 333 | 316 | 275 | 316 | 274 |
| ordinary copper foil peeling strength | lb/in | 3.6 | 4.4 | 4.8 | 3.6 | 3.5 | 4.7 | 3.3 | 3.5 |
| ultra-thin copper foil peeling strength | lb/in | 2.6 | 3.5 | 3.7 | 2.5 | 2.5 | 4.7 | 2.4 | 3.0 |
| coefficient of thermal expansion | ppm/° C. | 7.4 | 7.4 | 5.7 | 7.7 | 6.6 | 7.6 | 6.5 | 7.1 |

TABLE 8

Resin compositions of Comparative Examples (in part by weight) and test results

| Component | | C9 | C10 | C11 | C12 | C13 | C14 | C15 | C16 |
|---|---|---|---|---|---|---|---|---|---|
| prepolymer | PE1 | | | | | | | | |
| | PE2 | | | | | | | | |
| | PE3 | | | | | | | | |

TABLE 8-continued

Resin compositions of Comparative Examples (in part by weight) and test results

| | Component | C9 | C10 | C11 | C12 | C13 | C14 | C15 | C16 |
|---|---|---|---|---|---|---|---|---|---|
| | PE4 | | | | | | | | |
| | PE5 | | | | | | | | |
| | PE6 | | | | | | | | |
| | PE7 | | | | | | | | |
| | PE8 | | | | | | | | |
| | PE9 | | | | | | | | |
| | PE10 | | | | | | | | |
| | PE11 | | | | | | | | |
| | PE12 | | | | | | | | |
| prepolymerized product | PE13 | | | | | | | | |
| | PE14 | | | | | | | | |
| prepolymer | CPE1 | | | | | | | | |
| | CPE2 | | | | | | | | |
| | CPE3 | | | | | | | | |
| | CPE4 | | | | | | | | |
| | CPE5 | | | | | | | | |
| | CPE6 | | | | | | | | |
| | CPE7 | | | | | | | | |
| | CPE8 | | | | | | | | |
| | CPE9 | 100 | | | | | | | |
| | CPE10 | | 100 | | | | | | |
| | CPE11 | | | 100 | | | | | |
| | CPE12 | | | | 100 | | | | |
| | CPE13 | | | | | 100 | | | |
| | CPE14 | | | | | | 100 | | |
| prepolymerized product | CPE15 | | | | | | | 105 | |
| | CPE16 | | | | | | | | 105 |
| diallyl bisphenol resin | diallyl bisphenol A | 5 | 5 | 5 | 5 | 5 | 5 | | |
| | diallyl bisphenol F | | | | | | | | |
| | diallyl bisphenol S | | | | | | | | |
| maleimide resin | B MI-80 | | | | | | | | |
| amino-modified silicone | X-22-161B | | | | | | | | |
| cyclohexanone | cyclohexanone | | | | | | | | |
| diallyl resin | DAIP | | | | | | | | |
| phenolic resin | bisphenol A | | | | | | | | |
| inorganic filler | Silica A | Z*1 | Z*1 | Z*1 | Z*1 | Z*1 | Z*1 | Z*1 | Z*1 |
| curing accelerator | 2PZ | 0.5 | 0.5 | 0.5 | 0.5 | 0.5 | 0.5 | 0.5 | 0.5 |
| solvent (Sc = 60%) | MEK | PA | PA | PA | PA | PA | PA | PA | PA |
| | DMAC | PA | PA | PA | PA | PA | PA | PA | PA |
| | PMA | PA | PA | PA | PA | PA | PA | PA | PA |
| Property test | Unit | C9 | C10 | C11 | C12 | C13 | C14 | C15 | C16 |
| glass transition temperature | °C. | 245 | gel-ation | 310 | 254 | 270 | 292 | 312 | 350 |
| ordinary copper foil peeling strength | lb/in | 3.7 | | 3.5 | 4.2 | 4.3 | 3.5 | 3.6 | 5.2 |
| ultra-thin copper foil peeling strength | lb/in | 2.7 | | 2.5 | 4.0 | 4.1 | 2.3 | 2.5 | 3.2 |
| coefficient of thermal expansion | ppm/°C. | 8.2 | | 6.7 | 7.2 | 8.2 | 7.3 | 6.5 | 9.4 |

TABLE 9

Resin compositions of Comparative Examples (in part by weight) and test results

| | Component | C17 | C18 | C19 | C20 | C21 | C22 | C23 |
|---|---|---|---|---|---|---|---|---|
| prepolymer | PE1 | | | | | | | |
| | PE2 | 100 | 100 | 100 | 100 | | | |
| | PE3 | | | | | | | |
| | PE4 | | | | | | | |
| | PE5 | | | | | | | |
| | PE6 | | | | | | | |
| | PE7 | | | | | | | |
| | PE8 | | | | | | | |
| | PE9 | | | | | | | |
| | PE10 | | | | | | | |
| | PE11 | | | | | | | |
| | PE12 | | | | | | | |
| prepolymerized product | PE13 | | | | | | | |
| | PE14 | | | | | | | |
| prepolymer | CPE1 | | | | | | | |
| | CPE2 | | | | | | | |
| | CPE3 | | | | | | | |
| | CPE4 | | | | | | | |

TABLE 9-continued

Resin compositions of Comparative Examples (in part by weight) and test results

| | Component | C17 | C18 | C19 | C20 | C21 | C22 | C23 |
|---|---|---|---|---|---|---|---|---|
| | CPE5 | | | | | | | |
| | CPE6 | | | | | | | |
| | CPE7 | | | | | | | |
| | CPE8 | | | | | | | |
| | CPE9 | | | | | | | |
| | CPE10 | | | | | | | |
| | CPE11 | | | | | | | |
| | CPE12 | | | | | | | |
| | CPE13 | | | | | | | |
| | CPE14 | | | | | | | |
| prepolymerized product | CPE15 | | | | | | | |
| | CPE16 | | | | | | | |
| diallyl bisphenol resin | diallyl bisphenol A | | 35 | | | 5 | 5 | 5 |
| | diallyl bisphenol F | | | | | | | |
| | diallyl bisphenol S | | | | | | | |
| maleimide resin | BMI-80 | | | | | 100 | 78 | 78 |
| amino-modified silicone | X-22-161B | | | | | | 22 | 20 |
| cyclohexanone | cyclohexanone | | | | | | | 2 |
| diallyl resin | DAIP | | | 5 | | | | |
| phenolic resin | bisphenol A | | | | 5 | | | |
| inorganic filler | Silica A | Z*1 | Z*1 | Z*1 | Z*1 | Z*1 | Z*1 | Z*1 |
| curing accelerator | 2PZ | 0.5 | 0.5 | 0.5 | 0.5 | 0.5 | 0.5 | 0.5 |
| solvent (Sc = 60%) | MEK | PA | PA | PA | PA | PA | PA | PA |
| | DMAC | PA | PA | PA | PA | PA | PA | PA |
| | PMA | PA | PA | PA | PA | PA | PA | PA |
| Property test | Unit | C17 | C18 | C19 | C20 | C21 | C22 | C23 |
| glass transition temperature | °C. | 332 | 271 | 344 | 334 | 352 | 312 | 318 |
| ordinary copper foil peeling strength | lb/in | 3.2 | 4.9 | 3.3 | 3.5 | 5.5 | 2.5 | 3.2 |
| ultra-thin copper foil peeling strength | lb/in | 2.3 | 7.0 | 2.6 | 2.5 | 3.0 | 2.1 | 2.2 |
| coefficient of thermal expansion | ppm/°C. | 6.5 | 8.1 | 6.5 | 6.7 | 9.5 | 6.6 | 6.5 |

Resin compositions from Table 5 to Table 9 were used to make varnishes and various samples (specimens) as described below and tested under conditions specified below so as to obtain the test results.

Varnish

Components of the resin composition from each Example (abbreviated as E1 to E19) or each Comparative Example (abbreviated as C1 to C23) were placed into a stirred tank according to the amounts listed in Tables 5-9 for stirring and well-mixing to form a resin varnish.

For example, the resin composition of Example E1 was formulated by adding 100 parts by weight of the product from Prepolymer Preparation Example 1 and 5 parts by weight of diallyl bisphenol A to a stirrer containing a proper amount of methyl ethyl ketone, a proper amount of DMAC, and a proper amount of PMA as the solvent mixture, and stirred and well mixed (a proper amount of solvents is abbreviated as "PA" in Tables 5-9 to represent an amount of the solvents used to achieve a desirable solid content of the resin composition, such as a 60 wt % solid content of the varnish). Then "Z*1" parts by weight (i.e., 105 parts by weight) of Silica A were added and well dispersed, followed by adding 0.5 part by weight of 2-phenylimidazole (pre-dissolved by a proper amount of solvent) and stirring for 1 hour to obtain the varnish of resin composition E1.

In addition, according to the components and amounts listed in Table 5 to Table 9 above, varnishes of Examples E2 to E19 and Comparative Examples C1 to C23 were prepared following the preparation process of the varnish of Example E1.

Prepreg (Using 1027 E-Glass Fiber Fabric)

Resin compositions from different Examples (E1 to E19) and Comparative Examples (C1 to C23) listed in Table 5 to Table 9 were respectively added to an impregnation tank. A fiberglass fabric (e.g., 1027 E-glass fiber fabric) was passed through the impregnation tank to adhere the resin composition on the fiberglass fabric, followed by heating at 130° C. to 180° C. to the semi-cured state (B-Stage) to obtain the prepreg (resin content of about 73%).

Copper-Free Laminate (Obtained by Laminating Two Prepregs)

Two 18 µm reverse treatment copper foils (RTFs) and two prepregs made from each resin composition (using 2116 E-glass fiber fabrics) were prepared batchwise. Each prepreg has a resin content of about 45%. A copper foil, two prepregs and a copper foil were superimposed in such order and then subjected to a vacuum condition for lamination at 230° C. for 2 hours to form each copper-clad laminate sample. Insulation layers were formed by curing (C-stage) two sheets of superimposed prepreg between the two copper foils, and the resin content of the insulation layers was about 45%. Each copper-clad laminate was etched to remove the two copper foils to obtain a copper-free laminate (obtained by lamination of two prepregs).

Copper-Containing Laminate (Obtained by Laminating Eight Prepregs)

Two 18 µm reverse treatment copper foils (RTFs) and eight prepregs made from each resin composition (using 2116 E-glass fiber fabrics) were prepared batchwise. Each prepreg has a resin content of about 45%. A copper foil, eight prepregs and a copper foil were superimposed in such order and then subjected to a vacuum condition for lamination at 230° C. for 2 hours to form each copper-clad laminate sample. Insulation layers were formed by curing (C-stage) eight sheets of superimposed prepreg between the two copper foils, and the resin content of the insulation layers was about 45%.

Copper-Free Laminate (Obtained by Laminating Eight Prepregs)

Each copper-containing laminate (obtained by laminating eight prepregs) obtained above was etched to remove the two copper foils so as to obtain the copper-free laminate (obtained by laminating eight prepregs).

Four-Layer Circuit Board

A core was prepared as follows: preparing four prepregs (e.g., EM-827 available from Elite Material Co., Ltd., using 7628 E-glass fabric, RC=42%); a copper foil was covered on each of the two sides of the four superimposed prepregs, followed by lamination and curing for 2 hours in vacuum at high temperature (195° C.) and high pressure (360 psi) to obtain a copper-containing core. Then the core was subjected to a brown oxidation process to obtain a brown oxide treated core. Next, two sides on the outer layers of the brown oxide treated core were respectively covered with a prepreg (using 1027 E-glass fabric) from each Example or Comparative Example and a piece of 3 μm carrier-attached ultra-thin copper foil, followed by lamination for 2 hours in vacuum at 230° C. to obtain a laminate containing an ultra-thin copper foil. The carrier on the ultra-thin copper surface of the laminate was peeled off, and electroplating of the whole plate was performed without cleaning, such that the copper layer has a thickness of 35 μm to form a four-layer circuit board.

Test items and test methods are described below.

1. Glass Transition Temperature (Tg)

A copper-free laminate (obtained by laminating eight prepregs) sample was subjected to glass transition temperature measurement by using the dynamic mechanical analysis (DMA) method. Each sample was heated from 35° C. to 380° C. at a heating rate of 2° C./minute and then subjected to the measurement of glass transition temperature (° C.) by reference to the method described in IPC-TM-650 2.4.24.4. Higher glass transition temperature represents a better property of the sample.

For example, articles made from the resin composition disclosed herein have a high glass transition temperature as measured by reference to IPC-TM-650 2.4.24.4, such as a glass transition temperature Tg of greater than or equal to 284° C., such as between 284° C. and 342° C.

2. X-Axis Coefficient of Thermal Expansion (CTE)

The copper-free laminate (obtained by laminating two prepregs, resin content of about 45%) sample was tested by thermal mechanical analysis (TMA) during the measurement of X-axis coefficient of thermal expansion. The copper-free laminate was cut into a sample with a length of 15 mm and a width of 2 mm having a thickness of 8 mil. Each sample was heated from 30° C. to 260° C. at a temperature increase rate of 10° C./minute and then subjected to the measurement of coefficient of thermal expansion (ppm/° C.) in X-axis in a range (al) from 40° C. to 125° C. by reference to the processes described in IPC-TM-650 2.4.24.5. Lower X-axis coefficient of thermal expansion represents a better dimensional expansion property. A difference in X-axis coefficient of thermal expansion of greater than or equal to 0.1 ppm/° C. represents a substantial difference (i.e., significant technical difficulty).

For example, articles made from the resin composition disclosed herein have a low X-axis coefficient of thermal expansion as measured by reference to IPC-TM-650 2.4.24.5, such as an X-axis coefficient of thermal expansion of less than or equal to 7.6 ppm/° C., such as less than or equal to 6.0 ppm/° C., 6.2 ppm/° C., 6.4 ppm/° C., 6.5 ppm/° C., 6.6 ppm/° C., 6.7 ppm/° C., 6.9 ppm/° C., 7.1 ppm/° C., 7.2 ppm/° C. or 7.6 ppm/° C., such as between 6.0 ppm/° C. and 7.6 ppm/° C.

3. Ordinary Copper Foil Peeling Strength (Peel Strength, P/S)

A copper-containing laminate (obtained by laminating eight prepregs) was replaced with a copper foil laminate laminated by reverse treatment copper foil (RTF) with a thickness of 35 μm, which was then cut into a rectangular specimen with a width of 24 mm and a length of greater than 60 mm, and etched to remove surface copper foil, leaving a rectangular copper foil with a width of 3.18 mm and a length of greater than 60 mm. The specimen was tested by using a tensile strength tester by reference to IPC-TM-650 2.4.8 at ambient temperature (about 25° C.) to measure the force (lb/in) required to pull off the copper foil from the laminate surface. A higher copper foil peeling strength is more preferred, and a difference in copper foil peeling strength of greater than or equal to 0.1 lb/in represents a significant difference (i.e., significant technical difficulty).

For example, articles made from the resin composition disclosed herein are characterized by having an ordinary copper foil peeling strength as measured by reference to IPC-TM-650 2.4.8 of greater than or equal to 4.5 lb/in, such as greater than or equal to 4.5 lb/in, 4.6 lb/in, 4.7 lb/in, 4.8 lb/in, 4.9 lb/in, 5.0 lb/in, 5.1 lb/in or 5.2 lb/in, such as between 4.5 lb/in and 5.2 lb/in.

4. Ultra-Thin Copper Foil Peeling Strength (Peel Strength, P/S)

The four-layer circuit board was cut into a rectangular specimen with a width of 24 mm and a length of greater than 60 mm, which was etched to remove surface copper foil and leave a rectangular copper foil with a width of 3.18 mm and a length of greater than 60 mm. The specimen was tested by using a tensile strength tester by reference to IPC-TM-650 2.4.8 at ambient temperature (about 25° C.) to measure the force (lb/in) required to pull off the copper foil from the laminate surface. A higher copper foil peeling strength is more preferred, and a difference in copper foil peeling strength of greater than or equal to 0.1 lb/in represents a significant difference (i.e., significant technical difficulty).

For example, articles made from the resin composition disclosed herein are characterized by having an ultra-thin copper foil peeling strength as measured by reference to IPC-TM-650 2.4.8 of greater than or equal to 5.0 lb/in, such as greater than or equal to 5.0 lb/in, 5.1 lb/in, 5.2 lb/in, 5.3 lb/in, 5.5 lb/in, 5.6 lb/in, 5.7 lb/in, 5.8 lb/in, 6.0 lb/in, 6.2 lb/in, 6.3 lb/in, 6.7 lb/in or 6.9 lb/in, such as between 5.0 lb/in and 6.9 lb/in.

The following observations can be made from Table 5 to Table 9.

A side-by-side comparison of Examples E1-E12 and E15-E19 with Comparative Examples C1-C14 and C21-C23 indicates that by using a prepolymer formed by reacting 60 parts by weight to 80 parts by weight of a maleimide resin, 15 parts by weight to 30 parts by weight of an amino-modified silicone and 2 parts by weight to 15 parts by weight of cyclohexanone, in contrast to using a product formed by reactants different in type or amount from the above or using a composition in which reactants are directly mixed and added without prepolymerization, the article made from the present disclosure can achieve at the same time one, more or all properties including a high glass transition temperature, a low X-axis coefficient of thermal expansion, and a high ordinary copper foil peeling strength.

A side-by-side comparison of Examples E1-E12 and E15-E19 with Comparative Examples C17-C20 indicates that by using 5 parts by weight to 30 parts by weight of a diallyl bisphenol resin, in contrast to using reactants different in type or amount from the above, the article made from the present disclosure can achieve at the same time one, more or all properties including a high glass transition temperature, a low X-axis coefficient of thermal expansion, a high ordinary copper foil peeling strength, and a high ultra-thin copper foil peeling strength.

A side-by-side comparison of Examples E13-E14 and Comparative Examples C15-C16 and C21-C23 indicates that the prepolymerized product of the present disclosure (obtained by the reaction of the prepolymer and the diallyl bisphenol resin disclosed herein), in contrast to Comparative Examples in which cyclohexanone was not used in the prepolymer preparation process, in which cyclohexanone and amino-modified silicone were not used in the prepolymer preparation process and in which the prepolymer was obtained by directly adding the reaction mixture to the resin composition without carrying out the prepolymerization reaction, can achieve at the same time one, more or all properties including a low X-axis coefficient of thermal expansion, a high ordinary copper foil peeling strength, and a high ultra-thin copper foil peeling strength.

A side-by-side comparison of Examples E1-E19 and Comparative Examples C1-C23 indicates that by using 100 parts by weight of a prepolymer and 5 to 30 parts by weight of a diallyl bisphenol resin in combination or using a prepolymerized product made therefrom, the laminate thus obtained can achieve at the same time one, more or all properties including a glass transition temperature of greater than or equal to 284° C., an X-axis coefficient of thermal expansion of less than or equal to 7.6 ppm/° C., and an ordinary copper foil peeling strength of greater than or equal to 4.5 lb/in. In contrast, Comparative Examples C1-C23 not using the technical solution of the present disclosure fail to achieve the aforesaid technical effects at the same time.

In addition, a side-by-side comparison of Examples E1-E19 and Comparative Examples C1-C23 indicates that the article, made of the insulation layer formed by the resin composition disclosed herein and a copper foil with a thickness of less than or equal to 3 μm, can achieve at the same time one or both properties including a glass transition temperature of greater than or equal to 284° C. and an ultra-thin copper foil peeling strength of greater than or equal to 5.0 lb/in. In contrast, Comparative Examples C1-C23 not using the technical solution of the present disclosure fail to achieve the aforesaid technical effects at the same time.

According to the present disclosure, the peeling strength of ultra-thin copper foil (such as the thickness of copper foil is less than or equal to 3 μm) is greater than that of ordinary copper foil (such as the thickness of copper foil is greater than or equal to 35 μm). The peeling strength of ultra-thin copper foil is greater than or equal to 5.0 lb/in, and the peeling strength of ordinary copper foil is greater than or equal to 4.5 lb/in, which is mainly due to the synergistic result of the resin composition and the selected copper foil.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as more preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and all foreseeable equivalents at the time of filing this patent application.

What is claimed is:

1. A resin composition, comprising the following components or a prepolymerized product thereof:
   (A) 100 parts by weight of a prepolymer; and
   (B) 5 parts by weight to 30 parts by weight of a diallyl bisphenol resin;
   wherein the prepolymer is prepared by subjecting a reaction mixture to a prepolymerization reaction, the reaction mixture comprises a maleimide resin, an amino-modified silicone and a cyclohexanone, and relative to a total of 100 parts by weight of the maleimide resin, the amino-modified silicone and the cyclohexanone, the reaction mixture comprises 60 parts by weight to 80 parts by weight of the maleimide resin, 15 parts by weight to 30 parts by weight of the amino-modified silicone and 2 parts by weight to 15 parts by weight of the cyclohexanone;
   the reaction mixture does not comprise m-aminophenol or p-aminophenol; and
   the amino-modified silicone has an amino equivalent of 750 g/mol to 2500 g/mol.

2. The resin composition of claim 1, wherein the diallyl bisphenol resin comprises a compound of Formula (I) or a combination thereof:

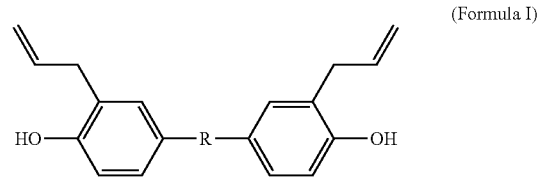

(Formula I)

in Formula (I), R is —C(CH$_3$)$_2$—, —CH$_2$— or —SO$_2$—.

3. The resin composition of claim 1, wherein the maleimide resin comprises oligomer of phenylmethane maleimide, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenylmaleimide, maleimide resin containing aliphatic long-chain structure or a combination thereof.

4. The resin composition of claim 1, wherein the amino-modified silicone comprises a compound of Formula (II):

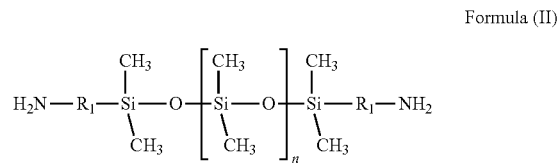

Formula (II)

in Formula (II), each $R_1$ independently represents a $C_1$-$C_{10}$ alkylene group, and n is an integer of 0 or greater.

5. The resin composition of claim 1, wherein the reaction mixture is reacted at 110° C. to 140° C. for 2 to 4 hours to prepare the prepolymer.

6. The resin composition of claim 1, wherein the component (A) and the component (B) are reacted at 110° C. to 140° C. for 20 to 60 minutes to prepare the prepolymerized product.

7. The resin composition of claim 1, wherein the cyclohexanone has a conversion rate of 50% to 95% in the prepolymerization reaction.

8. The resin composition of claim 1, wherein the reaction mixture comprises propylene glycol monomethyl ether, ethylene glycol methyl ether acetate, propylene glycol methyl ether acetate or a combination thereof as a solvent.

9. The resin composition of claim 1, further comprising a cyanate ester resin, a polyolefin resin, a small molecule vinyl compound, an acrylate resin, a phenolic resin, a polyphenylene ether resin, an epoxy resin, a benzoxazine resin, a styrene maleic anhydride resin, a polyester resin, an amine curing agent, a polyamide resin, a polyimide resin, or a combination thereof.

10. The resin composition of claim 1, further comprising flame retardant, inorganic filler, curing accelerator, polymerization inhibitor, coloring agent, solvent, toughening agent, silane coupling agent, or a combination thereof.

11. An article made from the resin composition of claim 1, wherein the article comprises a prepreg, a resin film, a laminate, or a printed circuit board.

12. The article of claim 11, which is the resin film, the laminate, or the printed circuit board and which comprises an insulation layer formed by the resin composition of claim 1 and a copper foil having a thickness of less than or equal to 6 μm disposed on the insulation layer.

13. The article of claim 12, further comprising a removable carrier disposed on the copper foil.

14. The article of claim 11, having a glass transition temperature as measured by using dynamic mechanical analysis by reference to IPC-TM-650 2.4.24.4 of greater than or equal to 284° C.

15. The article of claim 11, having an X-axis coefficient of thermal expansion as measured by reference to IPC-TM-650 2.4.24.5 of less than or equal to 7.6 ppm/° C.

16. The article of claim 11, which comprises a copper foil having a thickness of greater than or equal to 35 μm and which has a copper foil peeling strength as measured by reference to IPC-TM-650 2.4.8 of greater than or equal to 4.5 lb/in.

17. The article of claim 11, which comprises a copper foil having a thickness of less than or equal to 3 μm and which has a copper foil peeling strength as measured by reference to IPC-TM-650 2.4.8 of greater than or equal to 5.0 lb/in.

* * * * *